United States Patent [19]

Sugahara et al.

[11] Patent Number: 5,480,826
[45] Date of Patent: Jan. 2, 1996

[54] METHOD OF MANUFACTURING SEMICONDUCTOR DEVICE HAVING A CAPACITOR

[75] Inventors: Kazuyuki Sugahara; Hideaki Arima, both of Hyogo, Japan

[73] Assignee: Mitsubishi Denki Kabushiki Kaisha, Tokyo, Japan

[21] Appl. No.: 383,539

[22] Filed: Feb. 3, 1995

Related U.S. Application Data

[60] Continuation of Ser. No. 207,519, Mar. 8, 1994, abandoned, which is a division of Ser. No. 8,020, Jan. 22, 1993, Pat. No. 5,315,140.

[30] Foreign Application Priority Data

Apr. 24, 1992 [JP] Japan .................................. 4-106759

[51] Int. Cl.$^6$ .......................... H01L 21/70; H01L 27/00
[52] U.S. Cl. .................... 437/52; 437/60; 437/919
[58] Field of Search ............................ 437/47, 60, 48

[56] References Cited

U.S. PATENT DOCUMENTS 4,931,897  6/1990  Tsukamoto et al. ................ 257/296
5,061,650 10/1991  Deanison et al. .................. 257/306
5,091,761  2/1992  Hiraiwa et al. .................... 257/306
5,266,514 11/1993  Tuan et al. ......................... 437/52

OTHER PUBLICATIONS

IBM Technical Disclosure Bulletin, "High-density, Fold DRAM cell" vol. 23, No. 9B, Feb. 1990 pp. 378–381.

Kega et al "Crown-shaped Stacked Capacitor Cell for 1.5 v operation 64Mb DRAMS" IEEE Trans. on Electron Device, vol. 38, No. 2, Feb. 1991, pp. 255–261.

Inoue et al, "A New stacked capacitor cell with thin Box Structured Storage Node", Extended Abstract of 21st Conf. on Solid State Devices and Materials, Tokyo, 1989, pp. 141–144.

*Primary Examiner*—Olik Chaudhuri
*Assistant Examiner*—H. Jey Tsai
*Attorney, Agent, or Firm*—Lowe, Price, LeBlanc & Becker

[57] ABSTRACT

A semiconductor device includes a capacitor, of which insulator has an improved durability. In the semiconductor device, a capacitor lower electrode 11 of the cylindrical capacitor includes a standing wall portion 11b, which is formed of a polysilicon layer having a large crystal grain diameter (1000 Å–10000 Å).

6 Claims, 29 Drawing Sheets

FIG. 38        PRIOR ART
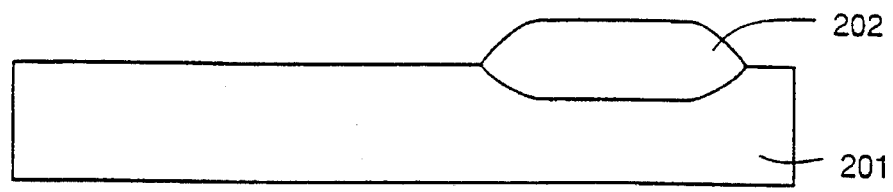
FIG. 39        PRIOR ART
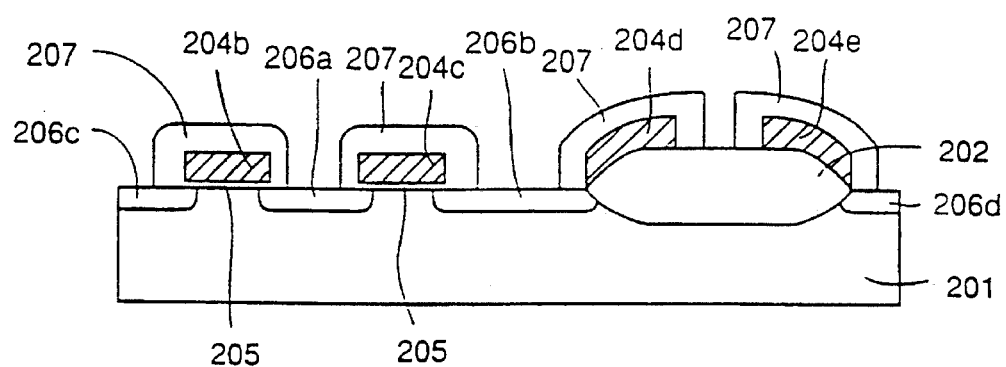
FIG. 40        PRIOR ART
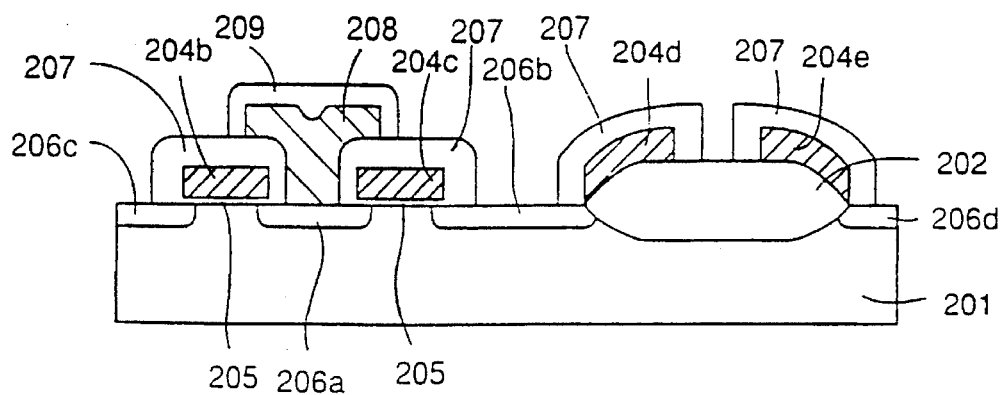

5,480,826

METHOD OF MANUFACTURING SEMICONDUCTOR DEVICE HAVING A CAPACITOR

This application is a continuation of application Ser. No. 08/207,519 filed Mar. 8, 1994, abandoned, which is a division of application Ser. No. 08/008,020, filed Jan. 22, 1993 U.S. Pat. No. 5,315,140.

BACKGROUND OF THE INVENTION

1. Field of the Invention

The present invention relates to a semiconductor device and a manufacturing method of the same, and in particular, to a dynamic random access memory (DRAM) and a manufacturing method of the same.

2. Description of the background Art

Owing to remarkable spread of information equipments such as a computer, demand for semiconductor memory devices has been rapidly increased. In particular, semiconductor devices having such functional features as large-scale memory capacities and high-speed operations have been demanded. Correspondingly, technical development has been progressed for high integration, high-speed responsibility and high reliability of the semiconductor memory devices.

Among the semiconductor memory devices, a DRAM (dynamic random access memory) has been known as a device capable of random input and output of memory information. In general, the DRAM is formed of a memory cell array, which is a memory region storing a large amount of information, and a peripheral circuitry required for external input and output.

FIG. 34 is a block diagram showing a construction of a conventional DRAM. Referring to FIG. 34, a DRAM 150 includes a memory cell array 151 for storing data signals of memory information, a row and column address buffer 152 for externally receiving an address signal which is used for selecting the memory cell forming a unit memory circuit, row and column decoders 153 and 154 which decode the address signal o designate the memory cell, a sense refresh amplifier 155 which amplifies the signal stored in the designated memory cell to read the same, data-in and data-out buffers 156 and 157 for data input and data output, and a clock generator 158 for generating a clock signal.

The memory cell array 151 occupying a large area in the semiconductor chip is formed of a plurality of memory cells for storing unit memory information disposed in a matrix form. FIG. 35 is an equivalent circuit diagram showing memory cells for 4 bits forming the memory cell array 151. Each memory cell is formed of one MOS (Metal Oxide Semiconductor) transistor and one capacitor connected thereto. Such memory cell is referred to as a memory cell of one-transistor and one-capacitor type. The memory cells of this type have simple structures and the degree of integration of the memory cell array can be easily increased, so that they have been widely used in DRAMs of large capacities.

The memory cells of the DRAMs can be classified into several types based on their structures of the capacitors. Among several types of the capacitors, a stacked type capacitor has such a feature that a major part of the capacitor may be extended over a gate electrode and a field isolating film, so that areas of opposed surfaces of electrodes of the capacitor can be increased and thus the capacitor capacitance can be increased. Since the stacked type capacitor has the foregoing feature, a sufficient capacitor capacitance can be ensured even if elements are miniaturized to a higher degree in accordance with the high integration of the semiconductor device. As a result, stacked type capacitors have been widely used in accordance with the high integration of the semiconductor devices. The semiconductor devices are now being further integrated, and the stacked type capacitors complying with it are now being developed. More specifically, a stacked type capacitor of a cylindrical form, which is intended to ensure an appropriate capacitor capacitance even if the semiconductor device is further integrated and thus has further miniaturized elements, has been proposed, e.g., Japanese Patent Application No. 02-89869 (1990).

FIG. 36 is a plan showing a conventionally proposed DRAM provided with cylindrical stacked type capacitors. FIG. 37 is a cross section of the DRAM taken along line X—X in FIG. 36.

Referring to FIGS. 36 and 37, the proposed DRAM in the prior art includes a silicon substrate 201, an element isolating oxide film 202 formed on a predetermined region of a major surface of the silicon substrate 201 for isolating elements, source/drain regions 206a, 206b, 206c and 206d, which are formed in regions surrounded by the element isolating oxide film 202 with predetermined spaces therebetween and are Located at opposite sides of a channel region 220, gate electrodes 204b and 204c formed on the channel regions 220 with gate oxide films 205 therebetween, word lines (gate electrodes) 204d and 204e formed on the element isolating oxide film 202 with a predetermined space therebetween, and insulating films 207 covering the gale electrodes 204b, 204c, 204d and 204e. The source/drain regions 206a and 206b and the gate electrode 204c form a transfer gate transistor 203 of one of the memory cells. The source/drain regions 206a and 206c and the gate electrode 204b form the transfer gate transistor 203 of the other memory cell.

The proposed DPAM in the prior art further includes a buried bit line 208 electrically connected to the source/drain region 206a, an insulating film 209 covering the buried bit line 208, a base portion 211a forming a storage node (capacitor lower electrode) 211 which is electrically connected to the source/drain region 206b and extends over the insulating films 207 and 209, a standing wall portion 211b which is formed on the base portion 211a and extends perpendicularly to the silicon substrate 201 from the outermost edge of the .base portion 211a for forming the storage node 211, a capacitor insulating film 212 covering the base portion 211a and the standing wall portion 211b, a cell plate 213 (capacitor upper electrode) covering the capacitor insulating film 212, an interlayer insulating film 214 covering the cell plate 213 and having a flat surface, interconnection layers 215 formed on the interlayer insulating film 214 and corresponding to the gate electrodes 204b, 204c, 204d and 204e, respectively, and a protection film 216 covering the interconnection layers 215. The base portion 211a and standing wall portion 211b, which form the storage node 211, as well as the capacitor insulating film 212 and the cell plate 213 form a cylindrical stacked type capacitor 210 for accumulating the charges corresponding to the data signal. The base portion 211a and the standing wall portion 211b, which form the storage node 211, are formed of polysilicon layers. The capacitor insulating film 212 is formed, e.g., of a nitride film. The cell plate 213 is formed of a polysilicon layer.

FIGS. 38–51 are cross sections showing a manufacturing process (first–fourteenth steps) of the DRAM shown in FIG. 37. Referring to FIGS. 37 and 38–51, the manufacturing process of the conventional DRAM will be described below.

First, as shown in FIG. 38, the element isolating oxide film 202 is formed on the predetermined region of the major surface of the silicon substrate 1 by an LOCOS method.

Then, as shown in FIG. 39, a thermal oxidation method is used to form she gate oxide film 205, and then the gate electrodes (word lines) 204b, 204c, 204d and 204e are selectively formed. The insulating film 207 covering the gate electrodes 204b–204e are formed by two oxide film forming steps and two etching steps. The gate electrodes 204b, 204c, 204d and 204e covered with the insulating film 207 are used as a mask for ion implantation, by which impurity is ion-implanted into the surface of the silicon substrate 201. Thereby, the source/drain regions 206a, 206b, 206c and 206d are formed.

Then, as shown in FIG. 40, a high-melting point metal layer, e.g., of tungsten, molybdenum or titanium is formed and then is patterned into a predetermined shape. Thereby, the buried bit line 208 directly connected to the source/drain region 206a is formed. The insulating film 209 is formed to cover the buried bit line 208.

As shown in FIG. 41, a CVD method is used to form a polysilicon layer 211c doped with impurity on the whole surface of the silicon substrate 201.

As shown in FIG. 42, the polysilicon layer 211c is covered with an insulating layer 235 formed of, e.g., silicon oxide film (SiO$_2$). The thickness of this insulating layer 235 determines the height of the standing wall portion 211b which forms the storage node (the lower electrode of the capacitor).

As shown in FIG. 43, resist (not shown) is applied to the surface of the insulating layer 235, and lithography is used to pattern the same into a predetermined shape. Thereby, a resist pattern (capacitor insulating layer) 236 is formed. The width of the resist pattern 236 determines the space between the adjacent capacitors.

As shown in FIG. 44, the resist pattern 236 is used as a mask for applying anisotropic etching, by which the insulating layer 235 is selectively removed. Thereafter, the resist pattern 236 is removed.

As shown in FIG. 45, the CVD method is used to form a polysilicon layer 211d containing the impurity on the whole surface. The thickness of this polysilicon layer 211d is smaller than the thickness of the polysilicon layer 211c formed thereunder.

As shown in FIG. 46, a thick resist 237 is formed to cover the whole surface of the polysilicon layer 211d. Etchback is applied the resist 237 to expose the polysilicon layer 211d covering the upper surface of the insulating layer 235.

As shown in FIG. 47, the etching is applied to the exposed polysilicon layer 211d (see FIG. 46), and subsequently the etching is applied to the insulating layer 235 (see FIG. 46) in a self-aligned manner to remove the same. Thereby, the surface of the polysilicon layer 211c is partially exposed. Also, the standing wall portion 211b forming the storage node 211 is completed.

As shown in FIG. 48, the exposed polysilicon layer 211c (see FIG. 47) is removed in a self-aligned manner by the anisotropic etching. Thereafter, the resist 237 (see FIG. 47) is removed. Thereby, the base portion 211a forming the capacitor lower electrode (storage node) 211 is completed. Thus, the capacitor lower electrode (storage node) 211 formed of the base portion 211a and the standing wall portion 211b is completed.

As shown in FIG. 49, the thin capacitor insulating film 212 formed of,e.g., a silicon nitride film is formed on the surface of the capacitor lower electrode 211.

As shown in FIG. 50, the cell plate 213 made from electrically conductive polysilicon is formed on the whole surface. Thereby, the stacked type capacitor 210, which includes the base portion 211a and standing wall portion 211b forming the capacitor lower electrode 211 as well as the capacitor insulating film 212 and cell plate 213 is completed.

As shown in FIG. 51, the cell plate 213 is covered with the thick innerlayer insulating film 214. The interconnection layer 215 of, e.g., aluminum having a predetermined shape is formed on the surface of the interlayer insulating film 214.

Finally, as shown in FIG. 37, the surface of the interconnection layer 215 is covered with the protection film 216. By the foregoing steps, the memory cells of the conventional DRAM are formed As stated before, in the conventional DRAM, the standing wall portion 211b, which forms the cylindrical capacitor lower electrode (storage node) 211, is made of polysilicon.

The polysilicon generally has microscopical unevenness on its surface. FIG. 52 is an enlarged view of a portion of the polysilicon layer 211d indicated by A in the manufacturing step of FIG. 45. Referring to FIG. 52, the polysilicon layer 211d formed on the side surface of the insulating layer 235 has the surface roughness of about 1/10 of its thickness. For example, if the polysilicon layer 211d has the thickness of 1000 Å, its surface 300 has the roughness of about 100 Å. The unevenness of the surface of the polysilicon layer 211d is caused by the grain boundary. More specifically, the polysilicon layer 211d includes silicon crystal grains having different grain diameters in a range from about 200 Å to about 500 Å. Therefore, the crystal grains have different growth tales, and thus some grains grows more rapidly than others. As a result, the microscopical unevenness is formed in the upper surface of the polysilicon layer 211d.

Referring to FIG. 37, in a macroscopical view, the cell plate 213 has an angular end 213a which is formed on a surface of a bent portion of the standing wall portion 211b with the capacitor insulating film 212 therebetween. FIG. 53 is an enlarged cross section showing a portion B of the DRAM shown in FIG. 37. Referring to FIG. 53, the end 213a of the cell plate 213 opposed to the bent portion 301 of the standing wall portion 211b 301 has a protruding shape.

As stated above, in the prior art, the surface 300 of the standing wall portion 211b microscopically has the unevenness (see FIG. 52), and the end 213a of the cell plate 213 macroscopically has the protruding shape (see FIG. 53). The microscopically uneven surface 300 of the standing wall portion 211b and the macroscopical protruding end 213a of the cell plate 213 disadvantageously reduce the durability of the capacitor insulating film 212 in the prior art. More specifically, the microscopical unevenness of the surface 300 of the standing wall portion 211b causes irregular electric field applied to the capacitor insulating film 212, resulting in reduction of the durability of the insulating film. Further, the electric field is concentrated at the end 213a of the cell plate 213, which also reduces the durability of the capacitor insulating film 212.

SUMMARY OF THE INVENTION

An object of the invention is to provide a semiconductor device including a capacitor insulating film of which durability is improved.

Another object of the invention is to provide a semiconductor device in which microscopical unevenness of a capacitor lower electrode forming a capacitor is suppressed.

Still another object of the invention is to provide a semiconductor device in which a macroscopical protrusion of a capacitor upper electrode forming a capacitor is suppressed.

Yet another object of the invention is to provide a manufacturing method which facilitates manufacture of a semiconductor device capable of suppressing microscopical unevenness of a surface of a lower electrode of a capacitor.

Still another object of the invention is to provide a manufacturing method which facilitates manufacture of a semiconductor device capable of suppressing a macroscopical protrusion of a capacitor upper electrode.

According to a first aspect of the invention, a semiconductor device includes a semiconductor substrate of a second conductivity type having a major surface and an impurity region of a first conductivity type located in the major surface; an insulating layer formed on the major surface of the semiconductor substrate and having an opening reaching the impurity region; a capacitor lower electrode having a first portion, which is in contact with a surface of the impurity region and a surface of the insulating layer and is formed of silicon crystal having a first grain diameter, and a second portion, which is in contact with at least an outermost edge of the first portion, and extends upwardly from the major surface of the semiconductor substrate and is formed of silicon crystal having a second grain diameter larger than the first grain diameter; a capacitor insulating layer covering the surface of the capacitor lower electrode; and a capacitor upper electrode covering the surface of the capacitor insulating layer.

In operation, the capacitor lower electrode is formed of the first and second portions, and the second portion is in contact with at least the outermost edge of the first portion, extends upwardly from the major surface of the semiconductor substrate and is formed of the silicon crystal having the second grain diameter larger than the first grain diameter of the silicon crystal forming the first portion. Therefore, the microscopical unevenness of the surface of she second portion is suppressed as compared with the prior art. This prevents irregularity of the field related to the capacitor insulating layer covering the second portion.

According to another aspect of the invention, a semiconductor device includes a semiconductor substrate of a second conductivity type having a major surface and an impurity region of a first conductivity type located in the major surface; an insulating layer formed on the major surface of the semiconductor substrate and having an opening reaching the impurity region; a capacitor lower electrode having a first portion, which is in contact with a surface of the impurity region and a surface of the insulating layer, and a second portion, which is in contact with an lease an outermost edge of the first portion and extends upwardly from the major surface of the semiconductor substrate; a capacitor insulating layer covering the surface of the capacitor lower electrode; and a capacitor upper electrode covering the surface of the capacitor insulating layer. The second portion of the capacitor lower electrode has a portion which is located on an upper surface of the outermost edge of the first portion. The thickness, in a direction along the major surface of the semiconductor substrate, of this portion of the second portion gradually increases toward the lower side.

In operation, the capacitor lower electrode is formed of the first and second portions. The second portion is in contact with an least the outermost edge of the first portion and extends upwardly from the major surface of the semiconductor substrate. The second portion of the capacitor lower electrode has the portion which is located on the upper surface of the outermost edge of the first portion. The thickness, in the direction along the major surface of the semiconductor substrate, of this portion of the second portion gradually increases as the position move toward the lower side. Therefore, a protrusion of an end of the capacitor upper electrode, which is formed on the gradually thickened portion with the capacitor insulating layer therebetween, is made moderate. This effectively suppresses concentration of the field at the portion of the capacitor upper electrode having the protrusive shade thus moderated.

According to still another aspect of the invention, a manufacturing method of a semiconductor device includes the steps of: forming a first insulating layer located on a major surface of a semiconductor substrate and having an opening which is located at a predetermined position and reaches the major surface of the semiconductor substrate; forming a first conductive layer located in the opening and being in contact with a surface of the first insulating layer; forming a second insulating layer on a predetermined region of the first conductive layer; forming an amorphous silicon layer covering at least the second insulating layer; removing the amorphous silicon layer at lease from an upper surface of the second insulating layer and thereby exposing the upper surface of the second insulating layer; removing the exposed second insulating layer by etching; forming a capacitor insulating layer covering the amorphous silicon layer; polycrystallizing the amorphous silicon layer to form a polysilicon layer; and forming a second conductive layer covering the capacitor insulating layer.

In operation, the first insulating layer located on the major surface of the semiconductor substrate and having the opening, which is located at the predetermined position and reaches the major surface of the semiconductor substrate is formed. The first conductive layer located in the opening and being in contact with the surface of the first insulating layer is formed. The second insulating layer is formed on the predetermined region of the first conductive layer. The amorphous silicon layer is formed to cover at least the second insulating layer. The amorphous silicon layer is removed by the etching at least from an upper surface of the second insulating layer, and thereby the upper surface of the second insulating layer is exposed. The exposed second insulating layer is removed by etching. The capacitor insulating layer covering the amorphous silicon layer is formed. The amorphous silicon layer is polycrystallized to form the polysilicon layer. The second conductive layer covering the capacitor insulating layer is formed. Therefore, the surface roughness of the amorphous silicon layer is not increased by the etching, and thus the surface roughness of the polycrystal silicon layer, which is formed by the crystallization of the amorphous silicon layer after the etching, can be reduced.

According to yet another aspect of the invention, a manufacturing method of a semiconductor device includes the steps of: forming a first insulating layer located on a major surface of a semiconductor substrate and having an opening which is located at a predetermined position and reaches the major surface of the semiconductor substrate; forming a first conductive layer located in the opening and being in contact with a surface of the first insulating layer; forming a second insulating layer on a predetermined region of the first conductive layer; forming an etching mask on a predetermined region of the second insulating layer; applying etching to the second insulating layer, using the etching mask as a mask, to remove the second insulating layer at a region, on which the etching mask is not formed, and to excessively remove the second insulating layer at a region, which is located under a side end of the etching mask and is in contact with the first insulating layer, to a predetermined extent; forming a second conductive layer covering the second insulating layer after removal of the etching mask; removing the residual second insulating layer after patterning the second conductive layer; forming a capacitor insulating layer covering the first and second conductive layers; and forming a third conductive layer covering the capacitor insulating layer.

In operation, the first insulating layer is formed on the major surface of the semiconductor substrate. The first insulating layer has the opening, which is located at the predetermined position and reaches the major surface of the semiconductor substrate. The first conductive layer, which is located in the opening and is in contact with the surface of the first insulating layer, is formed. The second insulating layer is formed on the predetermined region of the first conductive layer. The etching mask is formed on the predetermined region of the second insulating layer. The etching is applied to the second insulating layer, using the etching mask as a mask, to remove the second insulating layer located at the region on which the etching mask is not formed and to excessively removing the second insulating layer at the region, which is located under the side end of the etching mask and is in contact with the first insulating layer, to the predetermined extent. The second conductive layer covering the second insulating layer is formed after the removal of the etching mask. The residual second insulating layer is removed after patterning the second conductive layer. The capacitor insulating layer covering the first and second conductive layers is formed. The third conductive layer covering the capacitor insulating layer is formed. Therefore, the second conductive layer enters a portion from which the second insulating layer is excessively removed so that a ben portion at a joined region of the first and second conductive layers has a moderate shape. Thereby, a protruding shape of the third conductive layer, which is formed on the bent portion with the capacitor insulating layer therebetween, is moderated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 38–51 are cross sections showing 1st to 14th steps in a manufacturing process of a DRAM in the prior art shown in FIG. 37, respectively;

DESCRIPTION OF THE PREFERRED EMBODIMENT

Embodiments of the invention will be described below with reference to the drawings.

Figure 1:
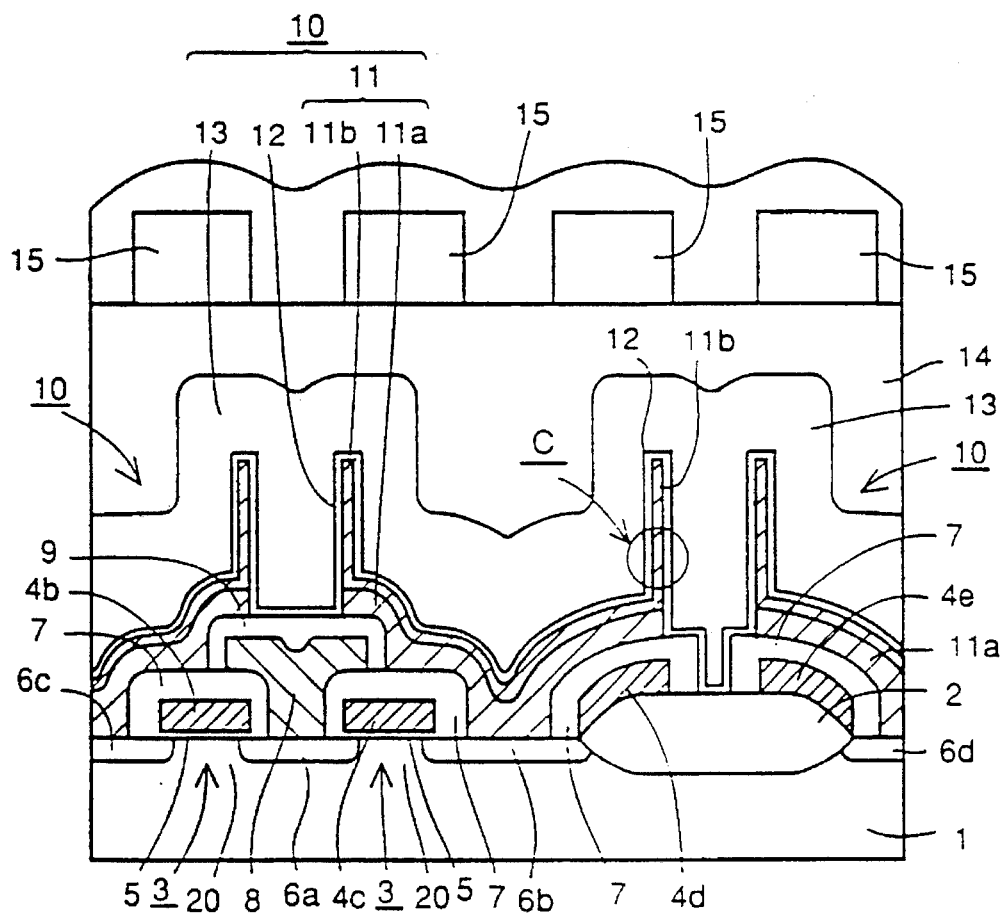
FIG. 1 is a cross section of a DRAM including a stacked type capacitor of an embodiment of the invention.
Figure 2:
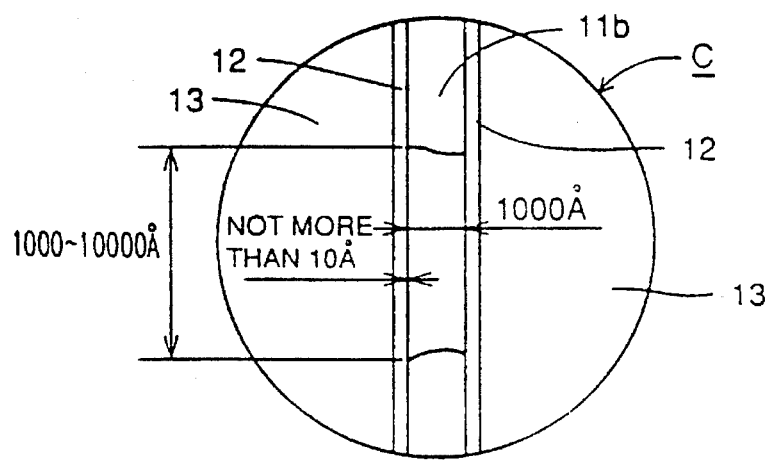
FIG. 2 is an enlarged cross section of a portion of a DRAM indicated by "C" in FIG. 1.

Referring to FIGS. 1 and 2, a DRAM of a first embodiment includes a silicon substrate 1, an element isolating oxide film 2 formed on a predetermined region of a major surface of the silicon substrate 1 for separating elements, source/drain regions 6a, 6b, 6c and 6d formed in regions surrounded by the element isolating oxide film 2 with predetermined spaces therebetween and located at opposite sides of a channel region 20, gate electrodes (word lines) 4b and 4c formed on the channel region 20 with a gate oxide film 5 therebetween, word lines (gate electrodes) 4d and 4e formed on the element isolating oxide film 2 with a predetermined space therebetween, and an insulating film 7 covering the gate electrodes 4b, 4c, 4d and 4e. The DRAM further includes a buried bit line 8 electrically connected to the source/drain region 6a, an insulating film 9 covering the buried bit line 8, a base portion 11a forming a capacitor lower electrode (storage node) which is electrically connected to the source/drain region 6b and extends over and along the insulating films 7 and 9, a standing wall portion 11b formed on the base portion 11a and extending perpendicularly to the silicon substrate 1 from the outermost edge of the base portion 11a, a capacitor insulating film 12 covering the base portion 11a and the standing wall portion 11b, a cell plate 13 covering the capacitor insulating film 12, an interlayer insulating film 14 covering the cell plate 13 and having a flat surface, interconnection layers 15 formed on the interlayer insulating film 14 and corresponding to the gate electrodes 4b, 4c, 4d and 4e, respectively, and a protection film 16 covering the interconnection layers 15.

The element isolating oxide film 2 is formed of a silicon oxide film of about 4000 Å in thickness. The gate electrodes 4b, 4c, 4d and 4e are formed of polysilicon layers deeply doped with arsenic (As). The insulating films 7 and 9 are formed of silicon nitride films ($Si_3N_4$) or silicon oxide films ($SiO_2$) and each are about 500 Å in thickness. The capacitor insulating film 12 is formed of a silicon nitride film, a silicon oxide film or a composite film thereof, or is formed of a tantalum pentoxide film ($Ta_2O_5$), a hafnium oxide film ($HaO_2$) or the like. The interlayer insulating film 14 is a silicon oxide film formed by the CVD method, and has a thickness in a range from about 5000 Å to about 10000 Å.

The protection film 16 is a silicon oxide film formed by the CVD method and is about 8000 Å in thickness. The source/drain regions 6a, 6b, 6c and 6d contain n-type impurity such as arsenic (As). The buried bit line 8 is a polysilicon layer containing a large amount of doped arsenic (As) or is a polycide layer formed by applying WSi$_2$ onto the same polysilicon layer by the sputter method. A whole thickness of the buried bit line 8 is in a range from about 2000 Å to about 4000 Å.

The base portion 11a forming the capacitor lower electrode (storage node) is formed of polysilicon containing a large amount of doped arsenic (As), and the crystal grain diameter of the polysilicon is in a range from about 200 Å to about 500 Å. This crystal grain diameter (200 Å–500 Å) is of a conventional value. The standing wall portion 11b forming the storage node is formed of polysilicon, which contains a large amount ($2\times10^{20}$/cm$^3$) of doped arsenic (As) or phosphorus (P) and has a crystal grain diameter in a range from about 1000 Å to about 10000 Å.

Figure 52:
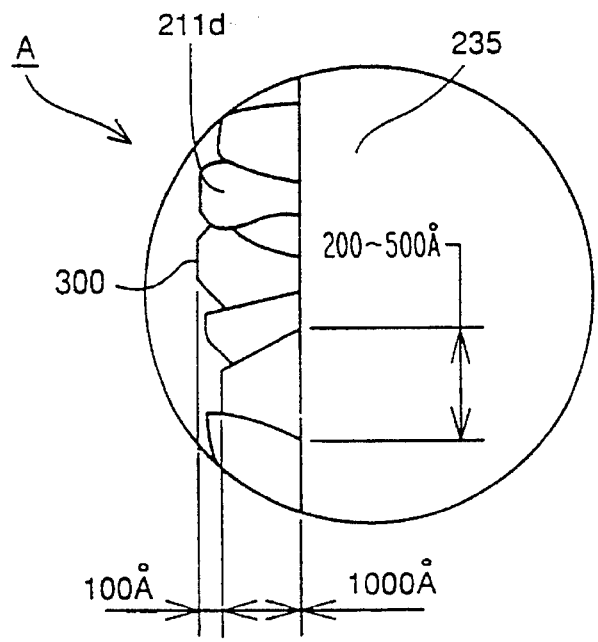
FIG. 52 is an enlarged cross section showing a portion indicated by "A" in FIG. 45 of a conventional DRAM in a manufacturing step in FIG. 45.
Figure 53:
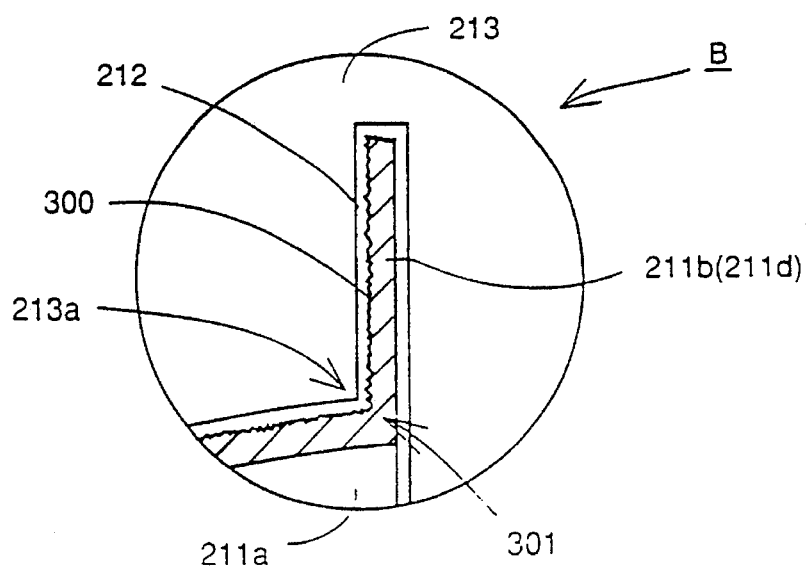
FIG. 53 is an enlarged cross section showing a portion indicated by "B" in FIG. 37 of a DRAM in the prior art.

As stated above, according to this embodiment, the crystal grain diameter (1000 Å–10000 Å) of the polysilicon forming the standing wall portion 11b is larger than the crystal grain diameter (200 Å–500 Å) of the polysilicon forming the base portion 11a. The large crystal grain diameter of the polysilicon forming the standing wall portion 11b reduces the surface roughness of the standing wall portion 11b as compared with the prior art. More specifically as shown in FIG. 2, the large crystal grain diameter (1000 Å–10000 Å) reduces the number of the microscopically convex and concave portions of the uneven surface of the standing wall portion 11b, as compared with the prior are (see FIG. 52). Further, by using a manufacturing process, which will be described later, the microscopically convex and concave portions of the surface of the standing wall portion 11b can be remarkably reduced, as compared with the prior art. If the standing wall portion 11b has the thickness of 1000 Å, the standing wall portion 11b can have the surface roughness of about 10 Å or less. Thereby, the irregularity of the field applied to the capacitor insulating film 12, which covers the standing wall portion 11b, is suppressed as compared with the prior art field. As a result, the durability of the capacitor insulating film 12 can be improved.

Now, the manufacturing process of the DRAM of the first embodiment will be described with reference to FIGS. 1 to 1b.

Figure 3:
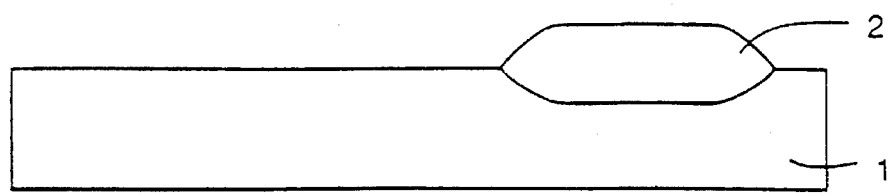
FIGS. 3–16 are cross sections showing 1st to 14th steps in a manufacturing process of a DRAM of a first embodiment shown in FIG. 1, respectively.

First, as shown in FIG. 3, the element separating oxide film 2 made of the silicon oxide film is formed to the thickness of about 4000 Å on the predetermined region of the major surface of the silicon substrate 1 by the LOCOS method.

Figure 4:
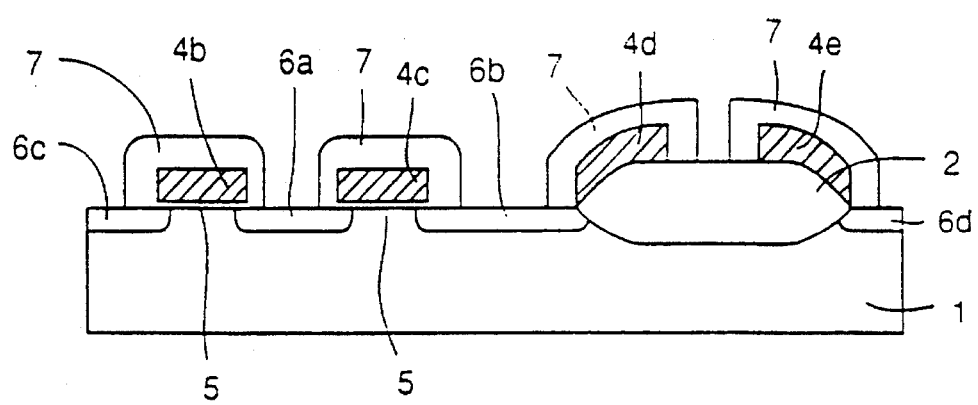

Then, as shown in FIG. 4, the gate oxide film 5 is formed by the thermal oxidation method or the like. The gate electrodes (word lines) 4b, 4c, 4d and 4e formed of the polysilicon containing a large amount of doped phosphorous (P) are selectively formed on the gate oxide film 5. The CVD method is used to execute the two 2 oxide film forming steps and the two etching steps, whereby the insulating film 7 covering the gate electrodes 4b, 4c, 4d and 4e is formed. The insulating film 7 is formed of the silicon nitride film (Si$_3$N$_4$) or the silicon oxide film (SiO$_2$) and has the thickness of about 500 Å. The insulating film 7 is used as a mask, and the ion implantation of the arsenic (As) is carried out under the conditions of 50 KeV and $4\times10^{15}$/cm$^2$. Thereby, the source/drain regions 6a, 6b, 6c and 6d are formed.

Figure 5:
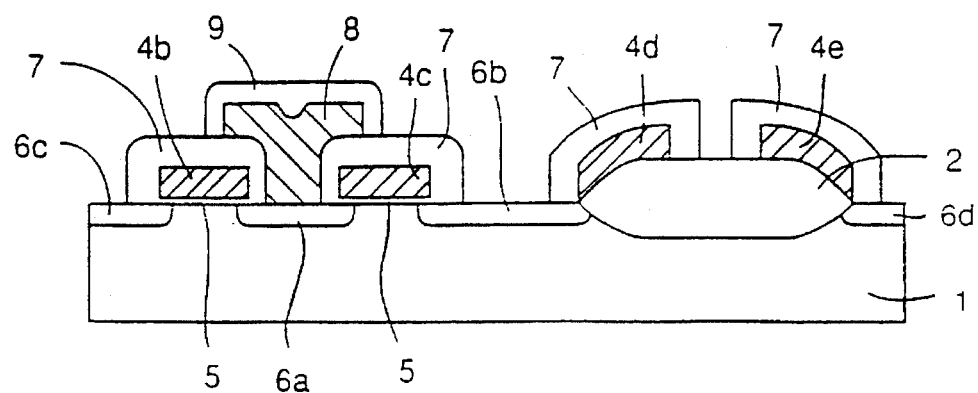

As shown in FIG. 5, after forming the polysilicon layer containing a large amount of doped arsenic, the patterning of the predetermined shape is applied to form the buried bit line 8 which directly contacts the source/drain region 6a. The buried bit line 8 may be formed of the polysilicon layer and polycide of WSi$_2$ which is formed on the same polysilicon layer by the sputter method. The thickness of the buried bit line 8 is determined to be about 2000 Å–4000. The insulating film 9 is formed to cover the buried bit line 8. The insulating film 9 is formed of the silicon nitride film or the silicon oxide film and has the thickness of about 500 Å.

Figure 6:
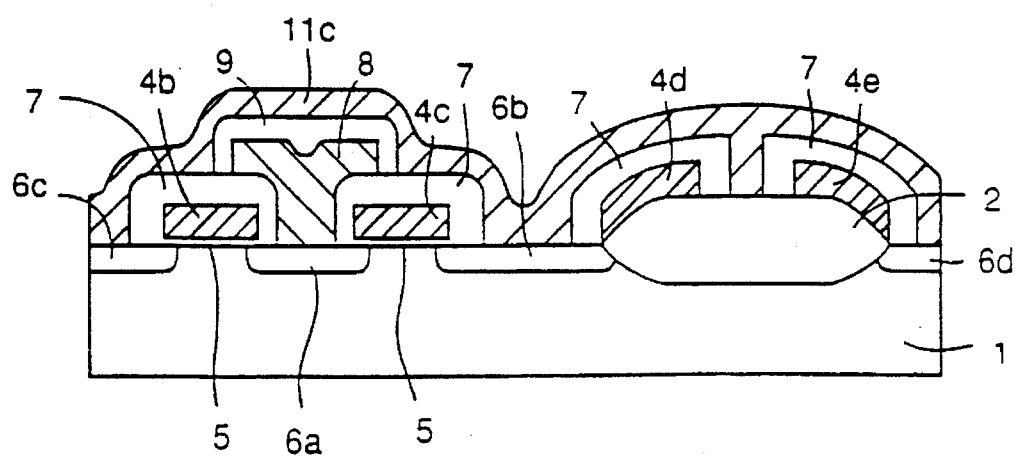

As shown in FIG. 6, the polysilicon layer 11c containing a amount of doped arsenic (As) is formed on the whole surface of the silicon substrate 1 by the CVD method. The crystal grain diameter of the polysilicon layer 11c is in a range from about 200 Å to about 500 Å as in the prior art.

Figure 7:
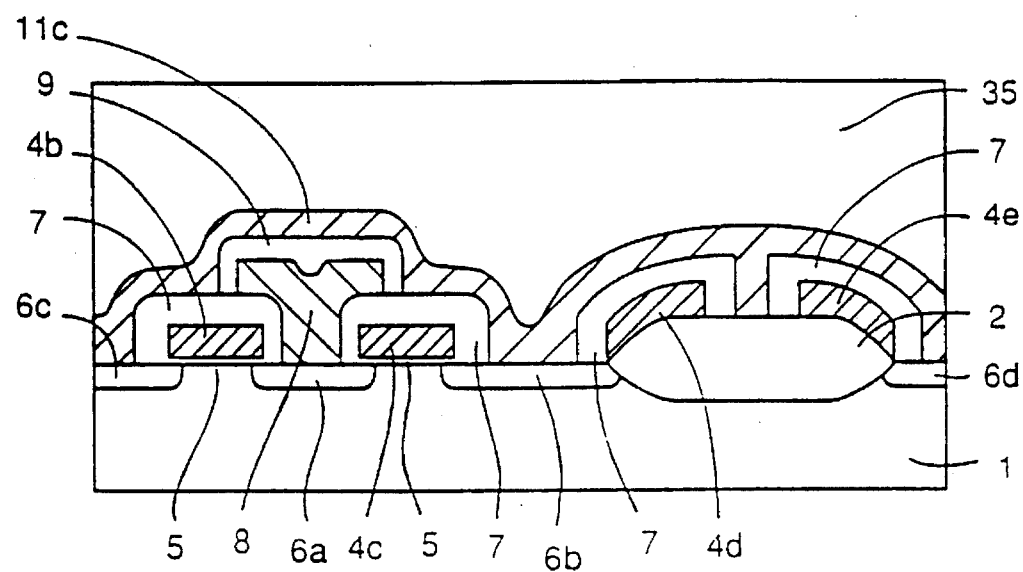

As shown in FIG. 7, the CVD method is used to form an interlayer insulating layer 35 made of the silicon oxide film and having the thickness in a range from about 5000 Å no about 6000 Å. The thickness of this insulating layer 35 will determine the height of the standing wall portion 11b (see FIG. 1) of the capacitor lower electrode (storage node) 11.

Figure 8:
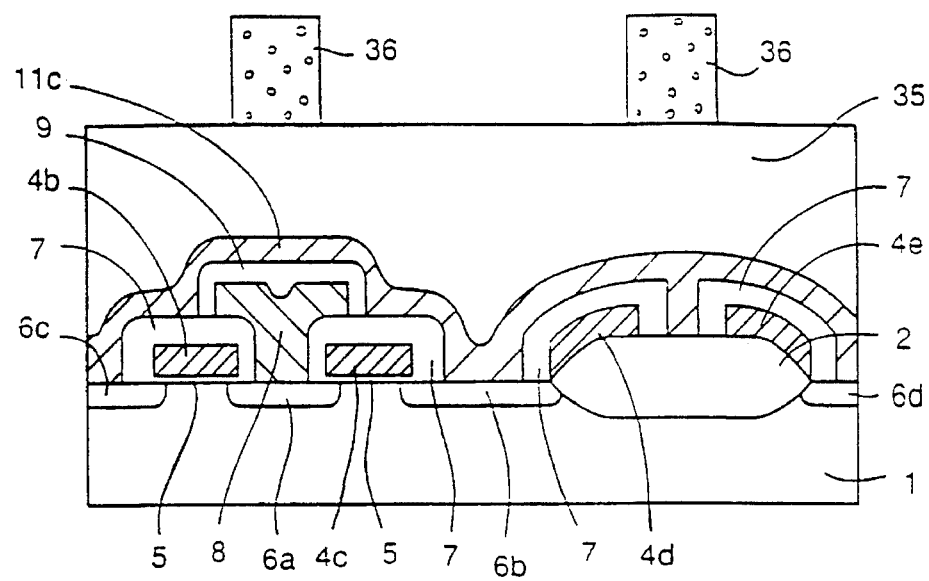

As shown in FIG. 8, resist (not shown) is applied to the surface of the insulating layer 35, and the patterning of the predetermined shape is executed, using the lithography or the like to form the resist pattern (capacitor separating layer) 36. The width of the resist pattern 36 determines a space by which the adjacent capacitors are separated.

Figure 9:
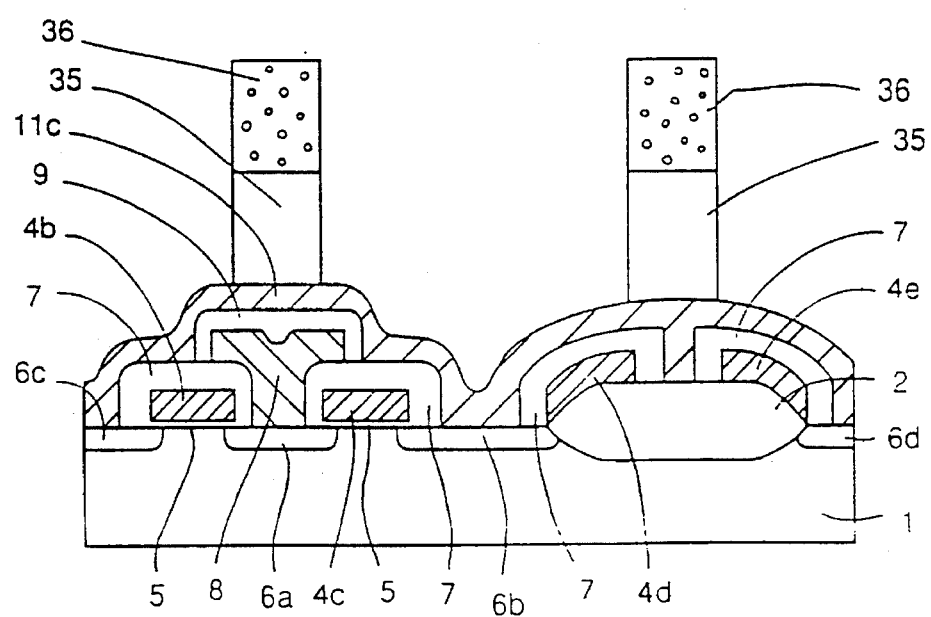

As shown in FIG. 9, the insulating layer 35 is selectively removed, using the resist pattern 36 as a mask. The etching for this removal is executed, e.g., by the anisotropic etching. If the width of the resist pattern 36 is desired to be smaller than the width of the insulating layer 35, wet etching may be additionally executed before removing the resist pattern 36.

Figure 10:
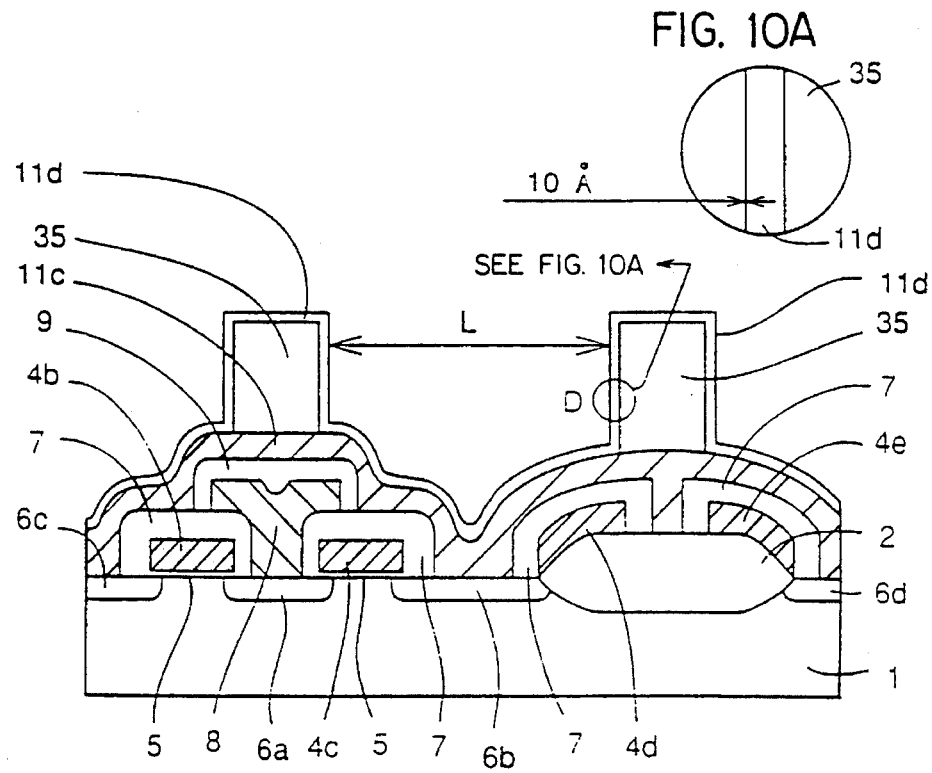

As shown in FIG. 10, the CVD method is used to form the amorphous silicon layer 11d containing the doped impurity and having the thickness of about 1000 Å. More specifically, the amorphous silicon layer 11d, which contains a large amount ($2\times10^?$/cm$^3$) of doped arsenic (As) or phosphorus (P), is formed by the CVD method under the temperature condition of 500° C.–550° C., using gas mixture of SiH$_4$, and AsH$_3$ gas mixture of SiH and PHs as material. The amorphous silicon layer 11d thus formed has the surface roughness of 10 Å or less. The thickness of the amorphous silicon layer 11d is determined to maximize an inner diameter indicated by "L" in FIG. 10.

Figure 11:
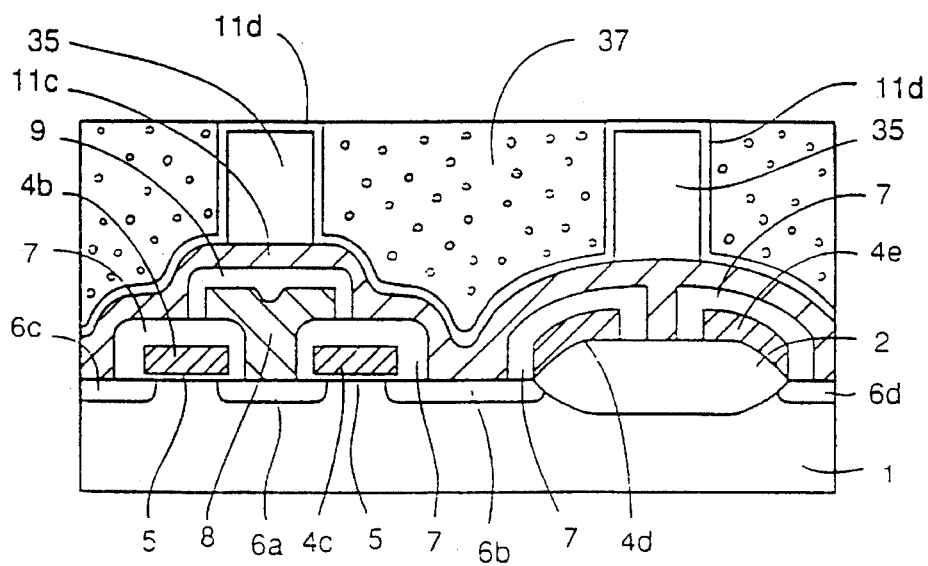

As shown in FIG. 11, thick resist 37 is applied to the amorphous silicon layer 11d for completely covering the surface thereof. The etchback is applied to the resist 37 to expose a part of the amorphous silicon layer 11d covering the upper surface of the insulating layer 35.

Figure 12:
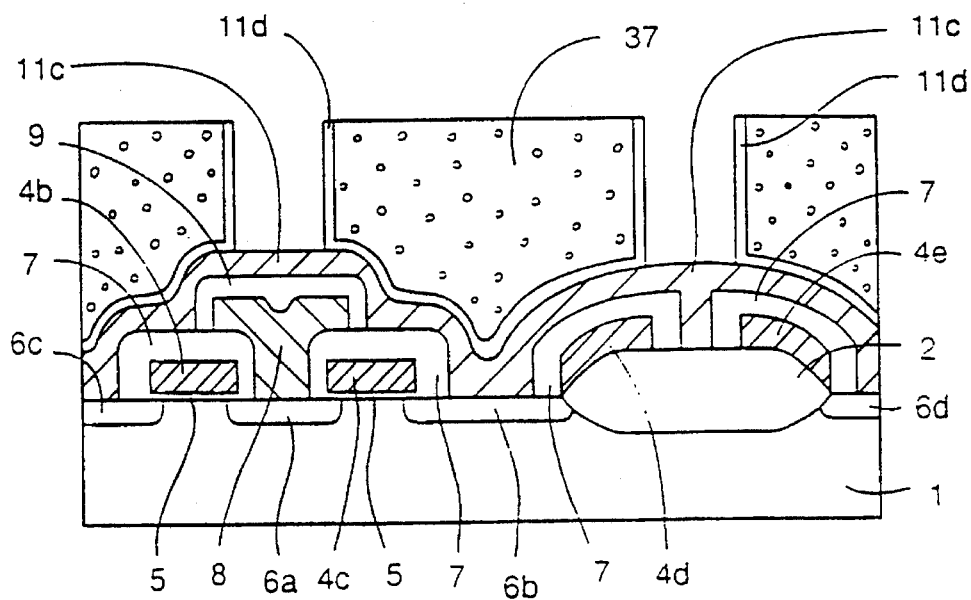

As shown in FIG. 12, the amorphous silicon layer 11d is etched, and subsequently the insulating layer 35 (see FIG. 11) is removed by the etching in a self-aligned manner. Thereby, the surface of the polysilicon layer 11c is exposed through an opening from which the insulating layer 35 (see FIG. 11) is removed.

Figure 13:
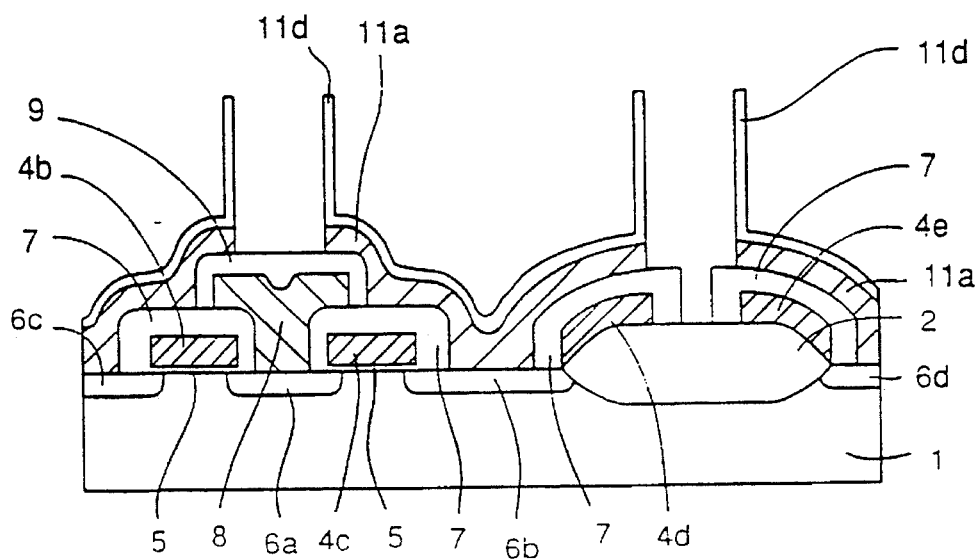

As shown in FIG. 13, the anisotropic etching is executed to remove only the exposed region of the polysilicon layer is (see FIG. 12) in the self-aligned manner. The etching applied to the polysilicon layer 11c does not roughen the surface of the amorphous silicon layer 11d. More specifically, due to the etching of the polysilicon layer 11c, the amorphous silicon layer 11d is etched to some extent. However, since the amorphous silicon layer 11d does not have any grain boundary, unlike the polysilicon layer, the grain boundary does not render the etching irregular. As a result, the surface of the amorphous silicon layer $11d$ is uniformly etched and thus the surface roughness, which was initially 10 Å or less, does not increase. The etching of the polysilicon layer $11c$ (see FIG. 12) also forms the base portion $11a$ (see FIG. 13) forming the capacitor lower electrode.

Figures 14, 14A:
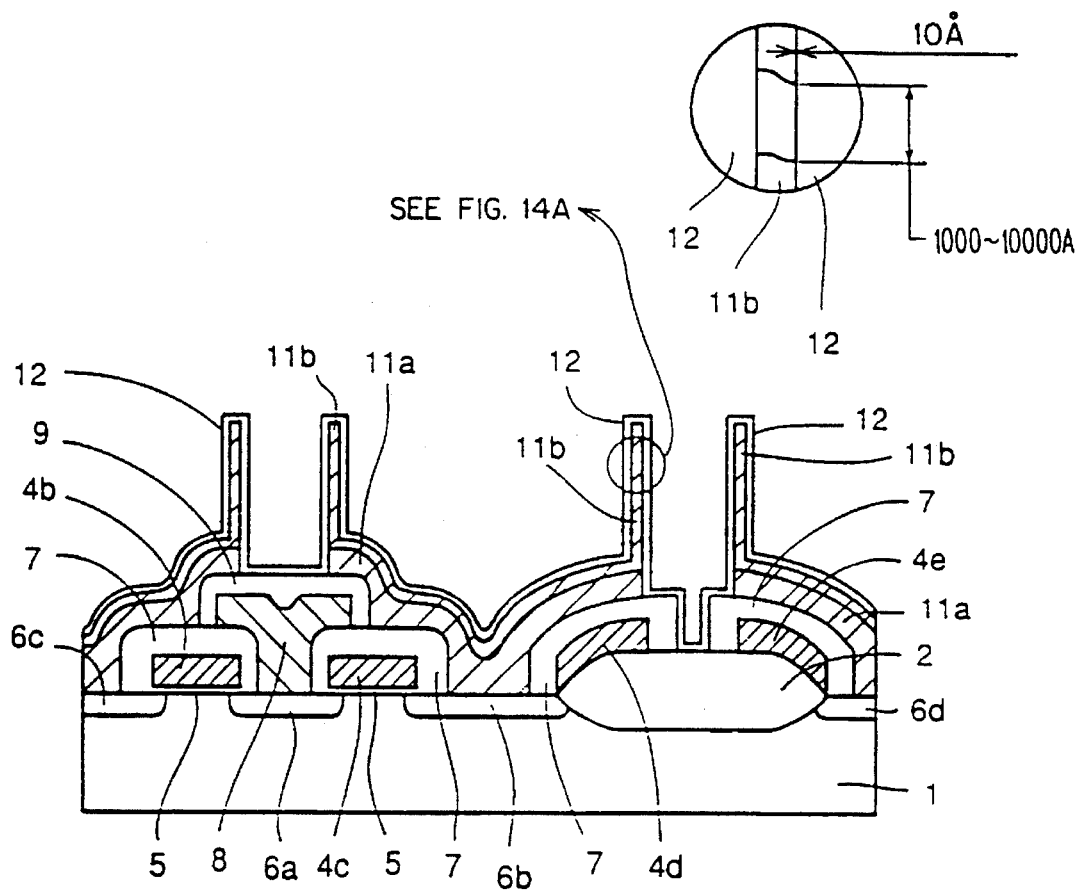

As shown in FIG. 14, the capacitor insulating film 12 is formed to cover the amorphous silicon layer $11d$ (see FIG. 13) and the base portion $11a$. The capacitor insulating film 12 is formed of a thin film made of the silicon nitride film, the silicon oxide film or the composite film thereof, or made of the tantalum pentoxide film ($Ta_2O_5$, the hafnium oxide film ($HaO_2$) or the like. The neat (about 700° C.) during the formation of the capacitor insulating film 12 polycrystallizes the amorphous silicon layer $11d$. Thereby, the standing wall portion $11b$ of the polysilicon layer is formed. That is; the amorphous silicon layer $11d$ is crystallized by the heat treatment (600°–950° C.) during the process. Owing to this crystallization, the polysilicon layer (standing wall portion) $11b$, which has the crystal grain diameter of 1000 Å–10000 Å, is formed with its surface maintained flat (surface roughness 10 Å or less). Here, the crystal grain diameter (1000 Å–10000 Å) of the silicon crystal forming the polysilicon layer (standing wall portion) $11b$ is larger than the crystal grain diameter (200 Å–500 Å) of the silicon crystal forming the conventional polysilicon layer. Therefore, the number of the microscopically concave and convex portions of the surface of the polysilicon layer (standing wall portion) $11b$ is extremely smaller than that in the prior art. As described above, since the standing wall portion $11b$ is formed of the polysilicon layer which has the extremely small surface roughness (10 Å or less) and a reduced number of the microscopically concave and convex portions of the surface, it is possible to effectively prevent the deviation of the field applied to the capacitor insulating film 12 covering the standing wall portion $11b$. Consequently, the durability of the capacitor insulating film 12 can be remarkably improved as compared with the prior art.

Figure 15:
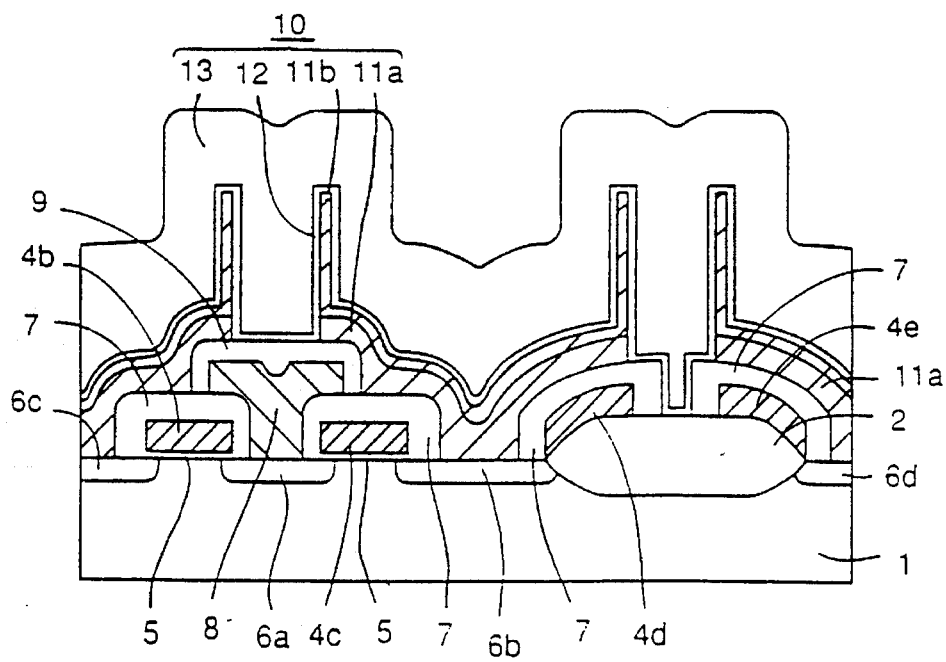

As shown in FIG. 15, the cell plate 13 made from the polysilicon containing a large amount of doped phosphorous is formed on the whole surface. The polysilicon layer forming the cell plate 13 has the crystal grain diameter of a conventional value (200 Å–500 Å).

Figure 16:
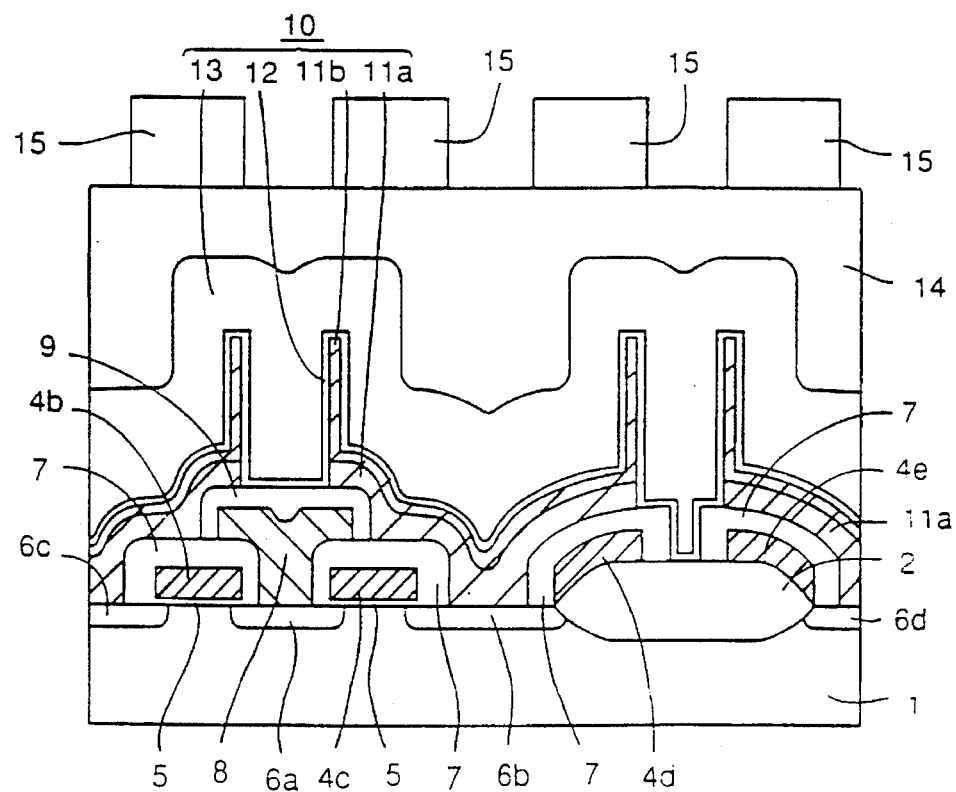

As shown in FIG. 16, the CVD method is used to form the interlayer insulating film 14 of 5000 Å–10000 Å in thickness on the whole surface. The interconnection layers 15, which correspond to he word lines $4b$, $4c$ $4d$ and $4e$, are formed, e.g., of aluminum with the predetermined spaces therebetween. The interconnection layers 15 thus formed have the thickness of about 5000 Å–10000 Å.

Finally as shown in FIG. 1 the CVD method is used no form the protection film 16 which covers the interconnection layer 1 and is made of the silicon oxide film. The protection film 16 thus formed has the thickness of about 8000 Å or less. By these steps the DRAM of the first embodiment is completed.

Figure 17:
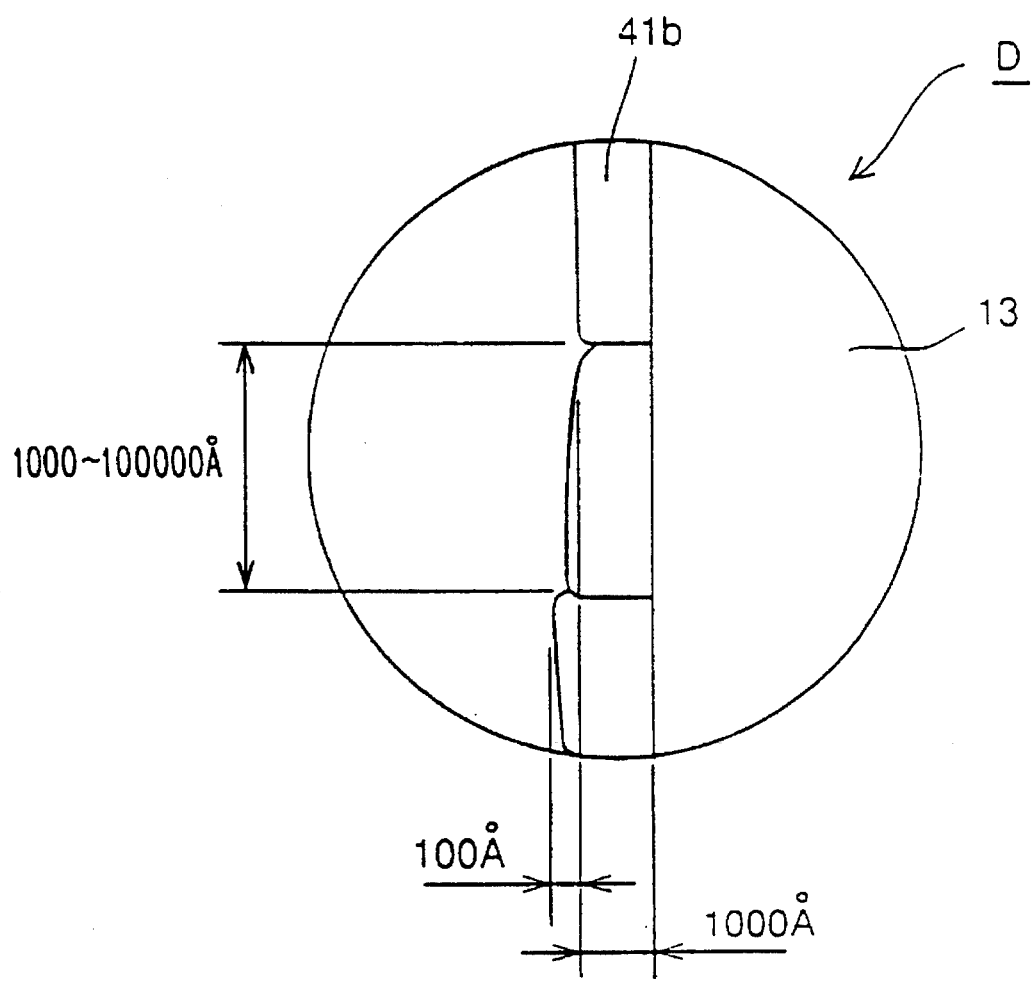
FIG. 17 is an enlarged cross section showing a portion indicated by "D" in FIG. 10 in a case that an amorphous silicon layer is replaced with a polysilicon layer in a manufacturing process of the first embodiment.

Referring to FIG. 17 in a case that a polysilicon layer $41b$ is formed to have a large crystal rain diameter (1000 Å–10000 Å) a an initial stage the number of the microscopically concave and convex portions can be reduced as compared with the prior art. That is; the conventional polysilicon layer $211d$ shown in FIG. 52 has the crystal grain diameter of 200 Å–500 Å, and, on the other hand, the polysilicon layer $41b$ shown in FIG. 17 has the crystal grain diameter of about 1000 Å–10000 Å. Therefore, although the degree of the microscopical unevenness of the surface is not reduced, the number of the microscopically concave and convex portions can be reduced. Consequently, the irregularly of the field, which is applied to he capacitor insulating film covered with the polysilicon layer $41b$, is suppressed as compared with the prior art. This can improve the durability of the capacitor insulating film.

Figure 18:
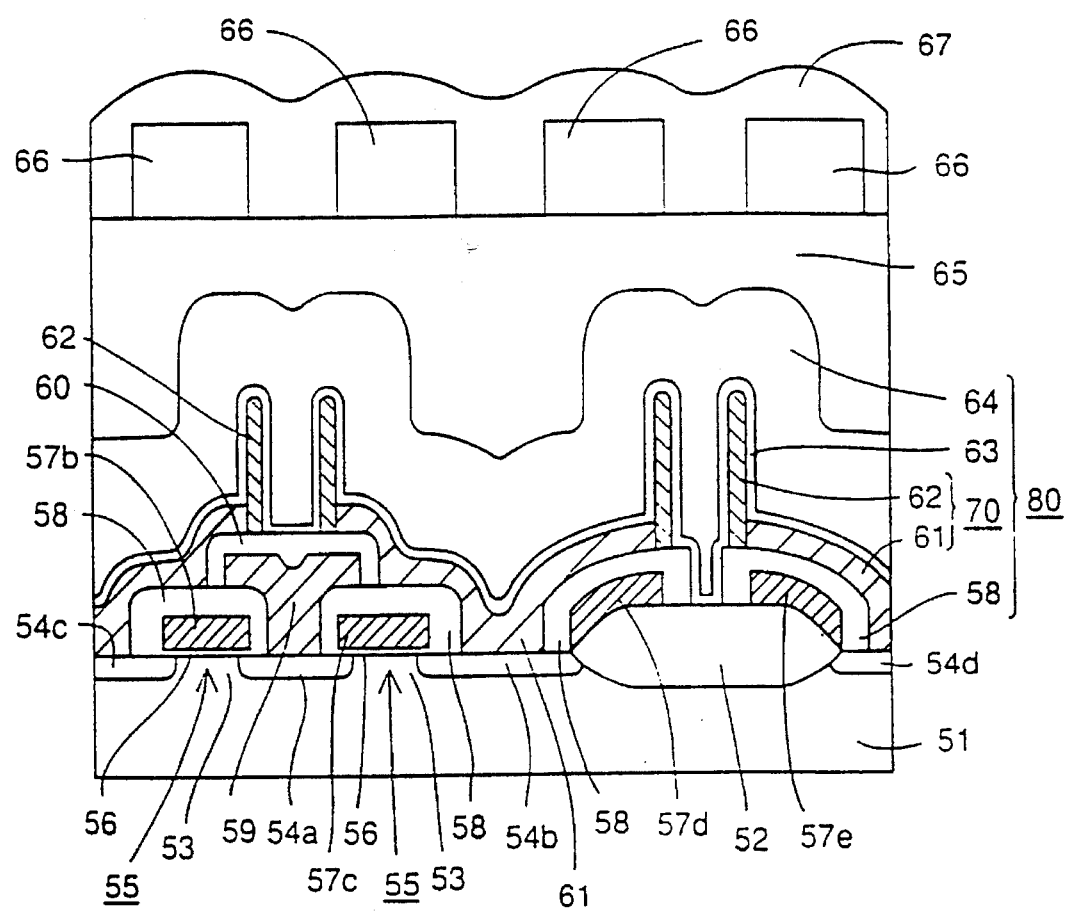
FIG. 18 is a cross section of a DRAM including a stacked type capacitor of a second embodiment of the invention.

Referring to FIG. 18, a DRAM of a second embodiment includes a silicon substrate 51, an element isolating oxide film 52 formed on a predetermined region of a major surface of the silicon substrate 51 for separating elements, source/drain regions $54a$, $54b$, $54c$ and $54d$ formed in regions surrounded by the element separating oxide film 52 with predetermined spaces therebetween and located at opposite sides of a channel region 53, gale electrodes (word lines) $57b$ and $57c$ formed on the channel region 53 with a gate oxide film 56 therebetween, word lines (gate electrodes) $57d$ and $57e$ formed on the element isolating oxide film 52 with a predetermined space therebetween, and an insulating film 58 covering the gate electrodes $57b$, $57c$, $57d$ and $57e$. The source/drain regions $54a$ and $54b$ and the gate electrode $57c$ form a transfer gate transistor 55 of one of the memory cells. The source/drain regions $54a$ and $54c$ and the gate electrode $57b$ form the transfer gate transistor 55 of the other memory cell. The source/drain regions $54a$, $54b$, $54c$ and $54d$ contain n-type impurity (e.g., arsenic) introduced thereto. The cake electrodes $57a$, $57b$, $57c$ and $57d$ are formed of polysilicon layers into which a large amount of arsenic (As) are doped. The element isolating oxide film 52 is about 4000 Å in thickness. The insulating film 58 is formed of a silicon nitride film ($Si_3N_4$) or a silicon oxide film and is about 500 Å in thickness.

The DRAM of the second embodiment further includes a buried bit line 59 electrically connected to the source/drain region $54a$, an insulating film 60 covering the buried bit line 59, a base portion 61, which is electrically connected to the source/drain region $54b$, extends over and along the insulating films 58 and 60 and forms the capacitor lower electrode (storage node) 70, a standing wall portion 62, which contacts the outermost edge of the base portion 61, extends perpendicularly to the silicon substrate 51 and forms a capacitor lower electrode 70, a capacitor insulating film 63 covering the standing wall portion 62 and the base portion 61, a cell plate 64 covering the capacitor insulating film 63, an interlayer insulating film 65 covering the cell plate 64, interconnection layers 66 formed of, e.g., aluminum on the interlayer insulating film 65 correspondingly to the gate electrodes $57b$, $57c$, $57d$ and $57e$ with predetermined spaces therebetween, and a protection film 67 covering the interconnection layer 66. The bit line 59 is formed, for example, of a polysilicon layer containing a large amount of doped arsenic or a polycide layer of $Wsi_2$ which is formed on the same polysilicon layer, and has the thickness of about 2000 Å–4000 Å. The insulating film 60 covering the bit line 59 is formed of a silicon nitride film ($Si_3N_4$) or a silicon oxide film, and has the thickness of about 500 Å. The base portion 61 forming the capacitor lower electrode (storage node) 70 is formed of a polysilicon layer containing a large amount of doped arsenic (As), and the crystal grain diameter of the polysilicon layer is in a range from about 200 Å to about 500 Å. The standing wall portion 62 is formed of a polysilicon layer having a crystal grain diameter in a range from about 1000 Å to about 10000 Å, similarly to the first embodiment. The capacitor insulating film 63 is formed of a silicon nitride film, a silicon oxide film or a composite film thereof, or is formed of a tantalum pentoxide film ($Ta_2O_5$), a hafnium oxide film ($HaO_2$) or others. The cell plate 64 is formed of a polysilicon layer, which contains a large amount of doped phosphorous and has the crystal grain diameter of 200 Å–500 Å. The interlayer insulating film 65 is formed of a silicon oxide film of about 5000 Å–10000 Å in thickness. The protection film 67 is formed of a silicon oxide film and has a thickness of about 8000 Å.

Also in the second embodiment, as stated above, the standing wall portion 62 forming the capacitor lower electrode (storage node) is formed of the polysilicon layer having the crystal grain diameter of about 1000 Å–10000 Å, whereby the effect similar to that of the first embodiment shown in FIGS. 1 and 2 can be obtained.

More specifically, since the standing wall portion (polysilicon layer) 62 has the crystal grain diameter (1000 Å–10000 Å) larger than the conventional value (200 Å–500 Å), the number of the microscopically concave and convex portions of the surface of the standing wall portion 62 is reduced. Also, by using the manufacturing process, which will be described later, the surface roughness (about 10 Å or less) of the standing wall 62 itself can be small as compared with the conventional value (100 Å). Consequently, it is possible to effectively prevent the variation of the field applied to the capacitor insulating film 63 covering the standing wall portion 62. Consequently, the durability of the capacitor insulating film 63 can be remarkably improved as compared with the prior art.

Now, a manufacturing process of a DRAM of the second embodiment will be described below with reference to FIGS. 18 and 19–30.

Figure 19:
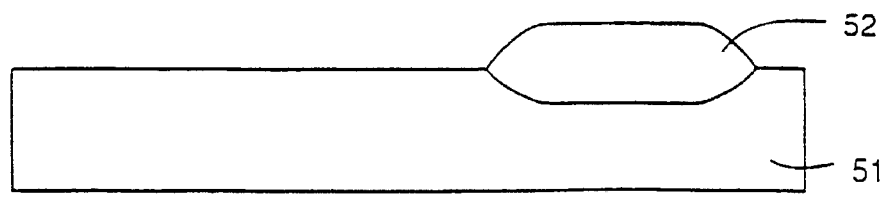
FIGS. 19–30 are cross sections showing 1st to 12th steps in a manufacturing process of a DRAM of the second embodiment shown in FIG. 18, respectively.

First, as shown in FIG. 19, the element separating oxide film 57 is formed at the thickness of about 4000 Å on the predetermined region of the major surface of the silicon substrate 51, e.g., by the LOCOS method.

Figure 20:
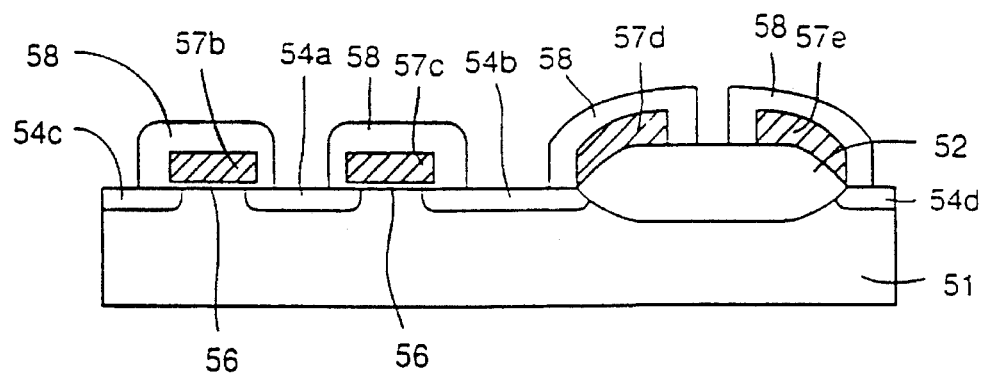

Then, as shown in FIG. 20, the thermal oxidation method or the like is used to form the gate oxide film 56 on the whole surface. Thereafter, the gate electrodes (word lines) 57b, 57c, 57d and 57e are selectively formed. The insulating film 58 made of the silicon oxide film is formed at the thickness of about 500 Å to cover the gate electrodes 57b, 57c, 57d and 57e. The ion implantation of arsenic (As) is carried out under the conditions of 50 KeV and $4 \times 10^{15}/cm^2$, using the silicon oxide film 58 and the gate electrodes 57b, 57c, 57d and 57e as a mask, whereby the source/drain regions 54a, 54b, 54c and 54d are formed.

Figure 21:
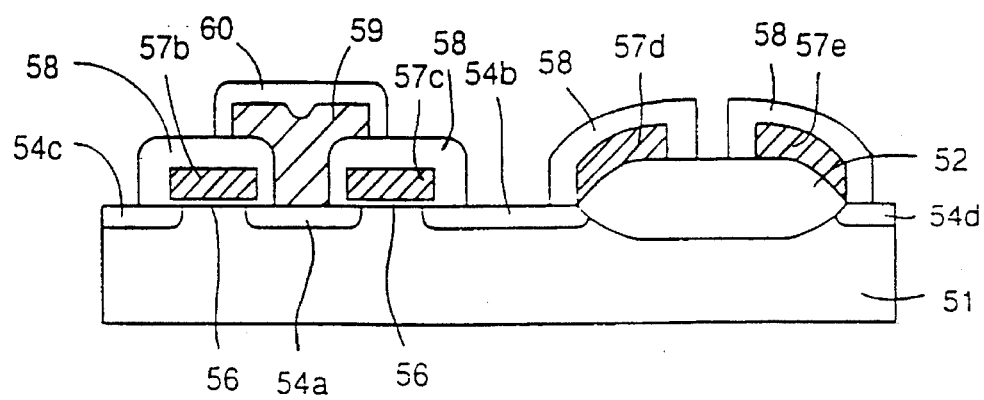

As shown in FIG. 21, after forming a polysilicon layer (not shown) containing a large amount of doped arsenic on the whole surface, the patterning is applied to form the buried bit line 59 which is electrically connected to the source/drain region 54a. The bit line 59 may be formed of the polysilicon layer and polycide of $Wsi_2$ formed on the polysilicon layer by the sputter method. The buried bit line 59 is formed to have the whole thickness of about 2000 Å–4000 Å. The insulating film 60 made of the silicon oxide film is formed at the thickness of about 500 Å to cover the buried bit line 59.

Figure 22:
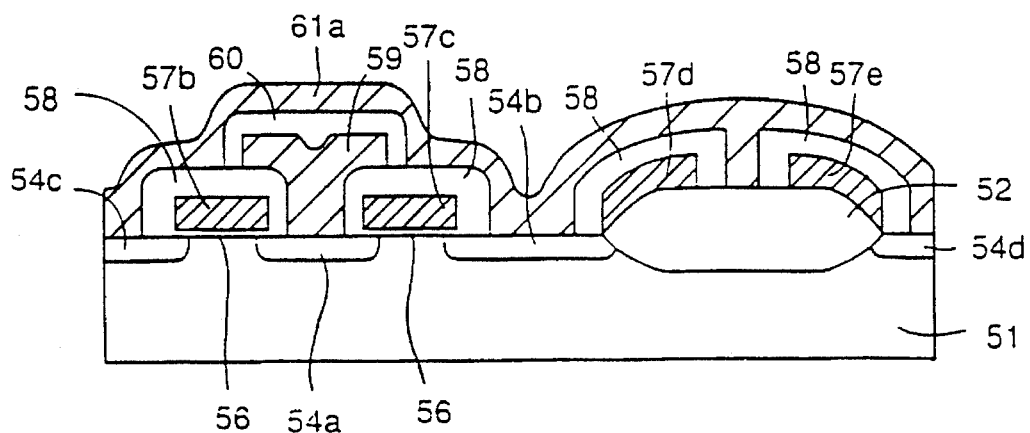

As shown in FIG. 22, a polysilicon layer 61a containing a large amount of arsenic doped in the whole surface is formed. The polysilicon layer 61a has the crystal grain diameter of a conventional value (about 200 Å–500 Å).

Figure 23:
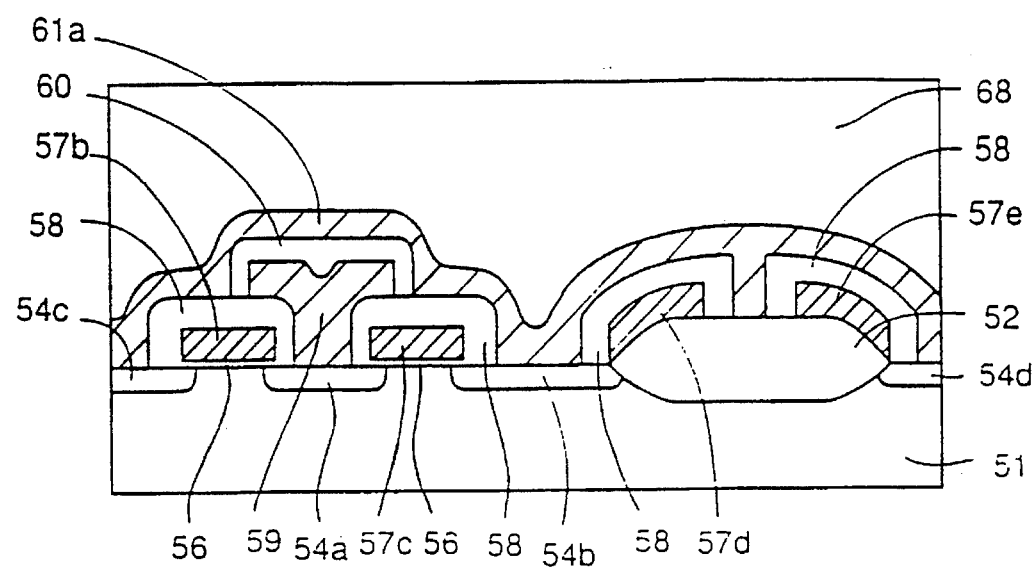

As shown in FIG. 23, the CVD method is applied to the whole surface to form an interlayer insulating film 68 made of the silicon oxide film to the thickness of about 5000 Å–6000 Å.

Figure 24:
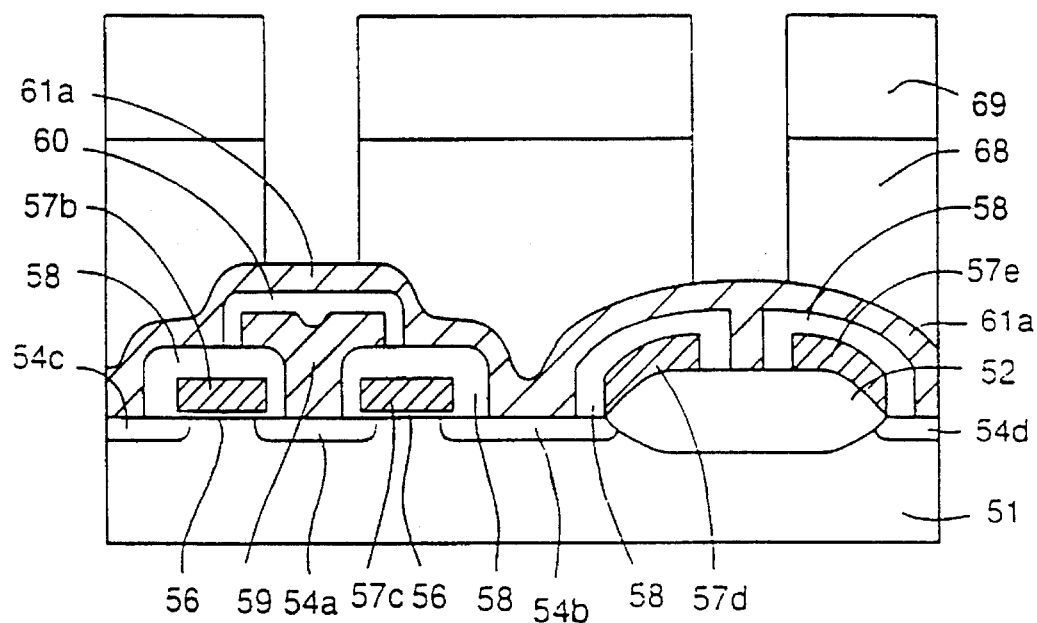

As shown in FIG. 24, resist 69 is formed at a predetermined region of the interlayer insulating film 68. Using the resist 69 as a mask, the anisotropic etching is applied to the interlayer insulating film 68 for selectively removing the interlayer insulating film 68. Thereafter, the resist 69 is removed.

Figure 25:
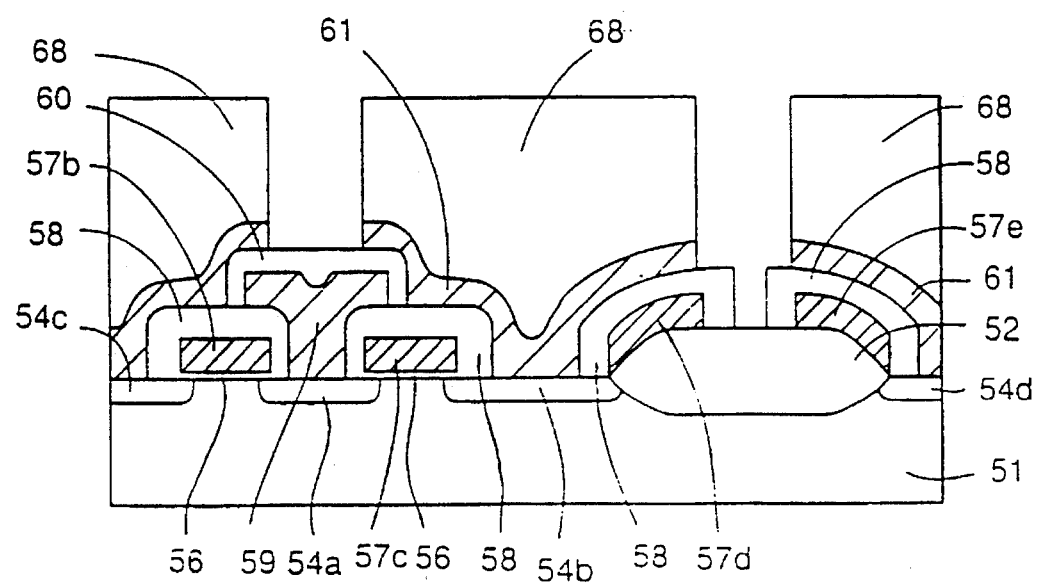

As shown in FIG. 25, the polysilicon layer 61a (see FIG. 24) is etched, using the interlayer insulating film 38 as a mask, whereby the polysilicon layer 61a is electively removed. Thereby, the base portion 61 forming the capacitor lower electrode (storage node) 70 is completed.

Figure 26:
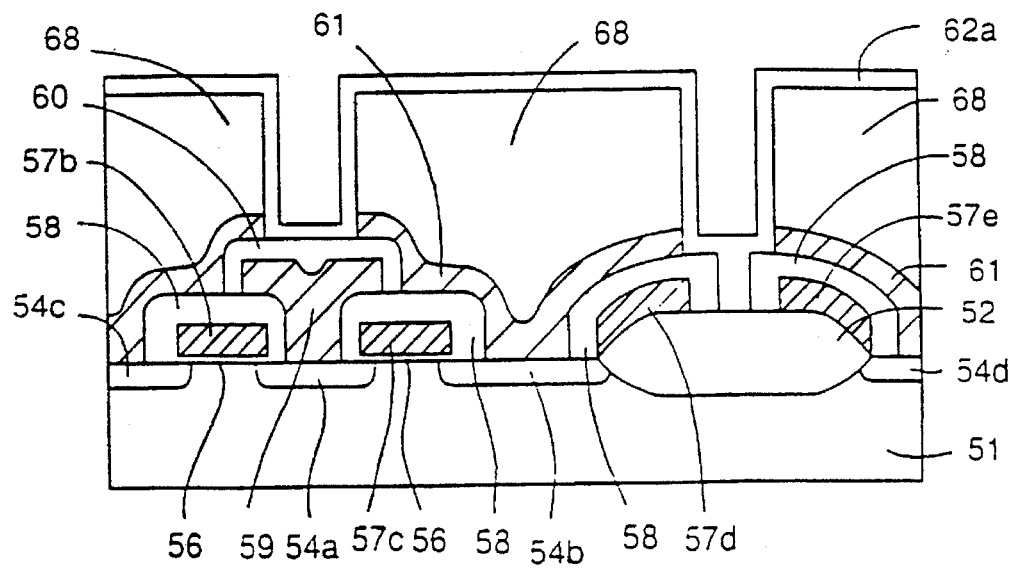

As shown in FIG. 26, an amorphous silicon layer 62a is formed to cover the interlayer insulating film 68. Specifically, the amorphous silicon layer 62a, which contains a large amount ($2 \times 10^{20}/cm^3$) of doped arsenic (As) phosphorus (P), is formed by the CVD method under the temperature condition of 500° C. 550° C., using gas mixture of $SiH_4$ and $AsH_3$ or gas mixture of $SiH_4$ and $PH_3$ as material. The amorphous silicon layer 62a thus formed can have the surface roughness of 10 Å or less, if its thickness is 1000 Å, similarly, o the amorphous silicon layer 11d of the first embodiment shown in FIG. 10.

Figure 27:
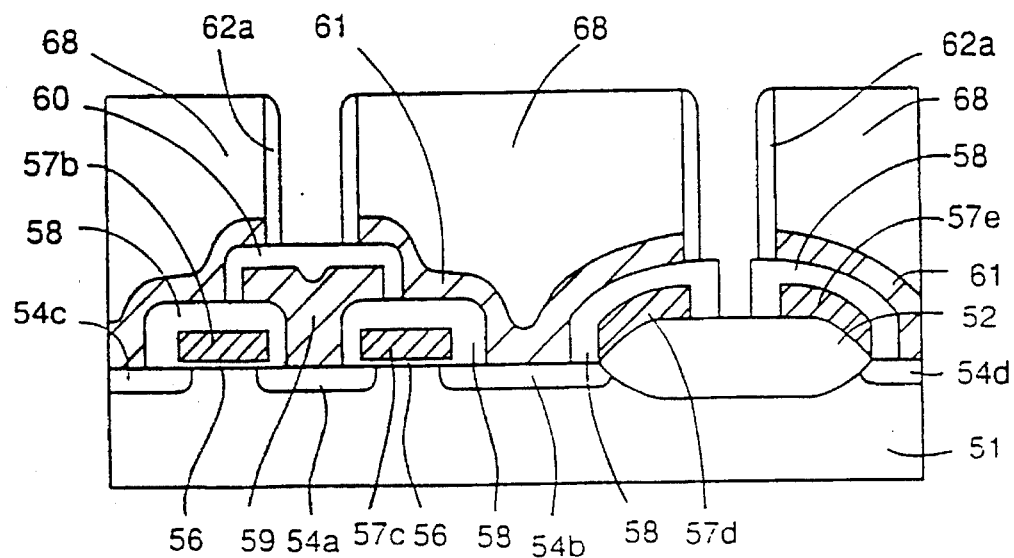
Figure 28:
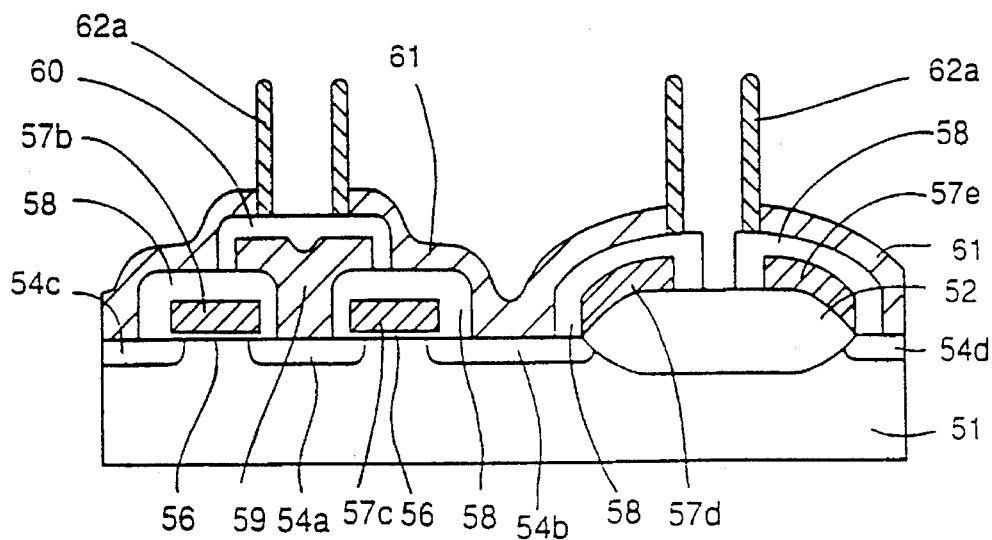

As shown in FIG. 27, the amorphous silicon layer 62a is selectively removed by the anisotropic etching. Although the side surface of the remaining amorphous silicon layer 62a is etched to some extent, it is etched uniformly because the layer 62a is not polysilicon. Therefore, the surface roughness (10 Å or less) of the remaining amorphous silicon layer 62a does not increase. Thereafter, the interlayer insulating film 68 is removed by the wet etching. Thereby, the construction shown in FIG. 28 is completed.

Figure 29:
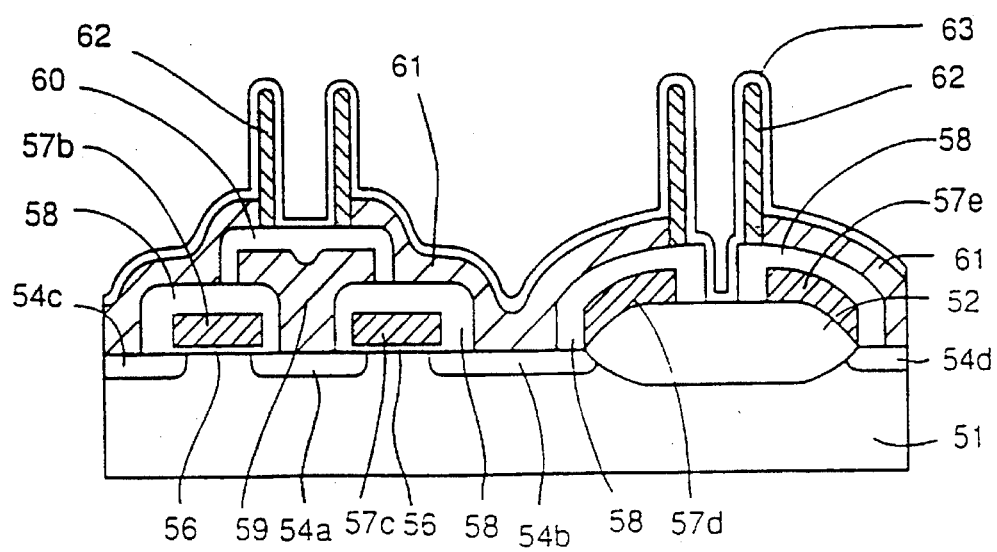

As shown in FIG. 29, the capacitor insulating film 63 is formed to cover the amorphous silicon layer 62a (see FIG. 28) and the base portion 61. The heat during the formation of the capacitor insulating film 63 polycrystallizes the amorphous silicon layer 62a. Thereby, the standing wall portion 62 of polysilicon is formed. More specifically, the amorphous silicon layer 62a is crystallized by the heat treatment (600° C. 950° C.) during the process and turns to the polysilicon layer 62 having the crystal grain diameter of about 1000 Å–10000 Å. The crystal grain diameter of about 1000 Å–10000 Å is larger than the crystal grain diameter (200 Å–500 Å) of the conventional polysilicon. Therefore, the number of the microscopically convex and concave portions of the surface of the standing wall portion (polysilicon layer) 62 can be reduced. The polysilicon layer 62 formed by polycrystallizing the amorphous silicon layer 62a maintains the surface roughness of the amorphous silicon layer 62a as it was. Therefore, the polysilicon layer (standing wall portion) 62 having the thickness of about 1000 Å has the surface roughness of about 10 Å or less. Therefore, the polysilicon layer (standing wall portion) 62, having the surface roughness (about 10 Å) which is remarkably smaller than the surface roughness (100 Å) of the conventional polysilicon layer, can be obtained. This can effectively prevents the irregularity of the field applied to the capacitor insulating film 63 covering the standing wall portion 62. Therefore, the durability of the capacitor insulating film 63 can be improved.

Figure 30:
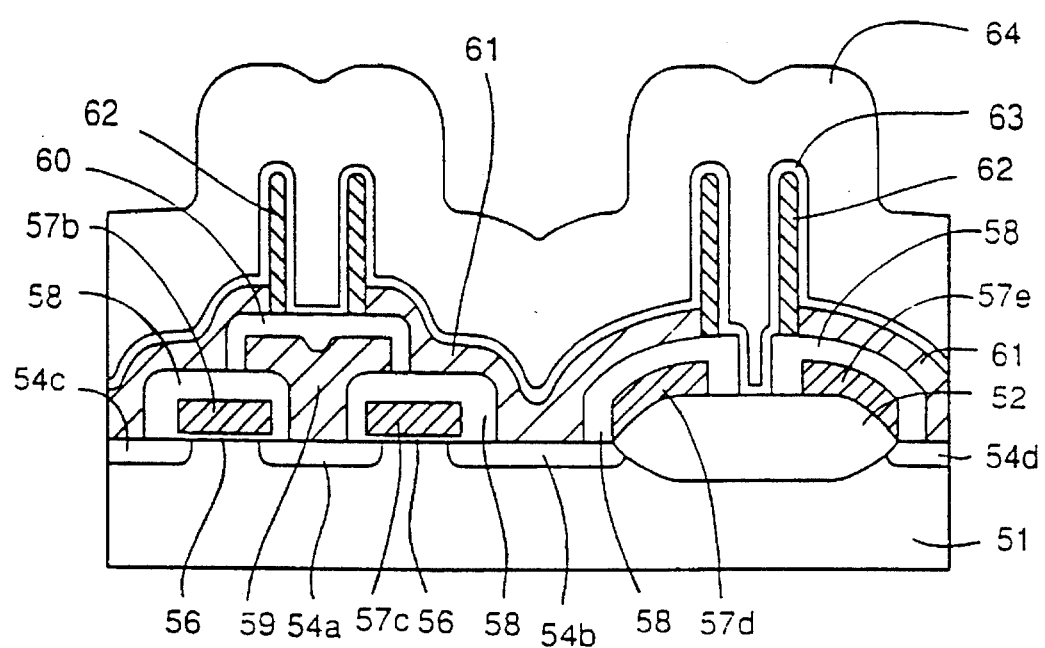

As shown in FIG. 30, the capacitor insulating film 63 is covered with the cell plate 64 which is formed of the polysilicon layer containing a large amount of doped phosphorous by the CVD method.

Finally, the cell plate 64 is covered by the innerlayer insulating film 65 formed by the CVD method at the thickness of about 5000 Å–10000 Å, as shown in FIG. 18. The interconnection layer 66 made from aluminum or the like is formed at the thickness of about 5000 Å–10000 Å on the interlayer insulating film 65. The CVD method is used to cover the interconnection layer 66 with the protection film formed of the silicon oxide film at the thickness of about 8000 Å. Thereby, the DRAM of the second embodiment is completed.

Figure 31:
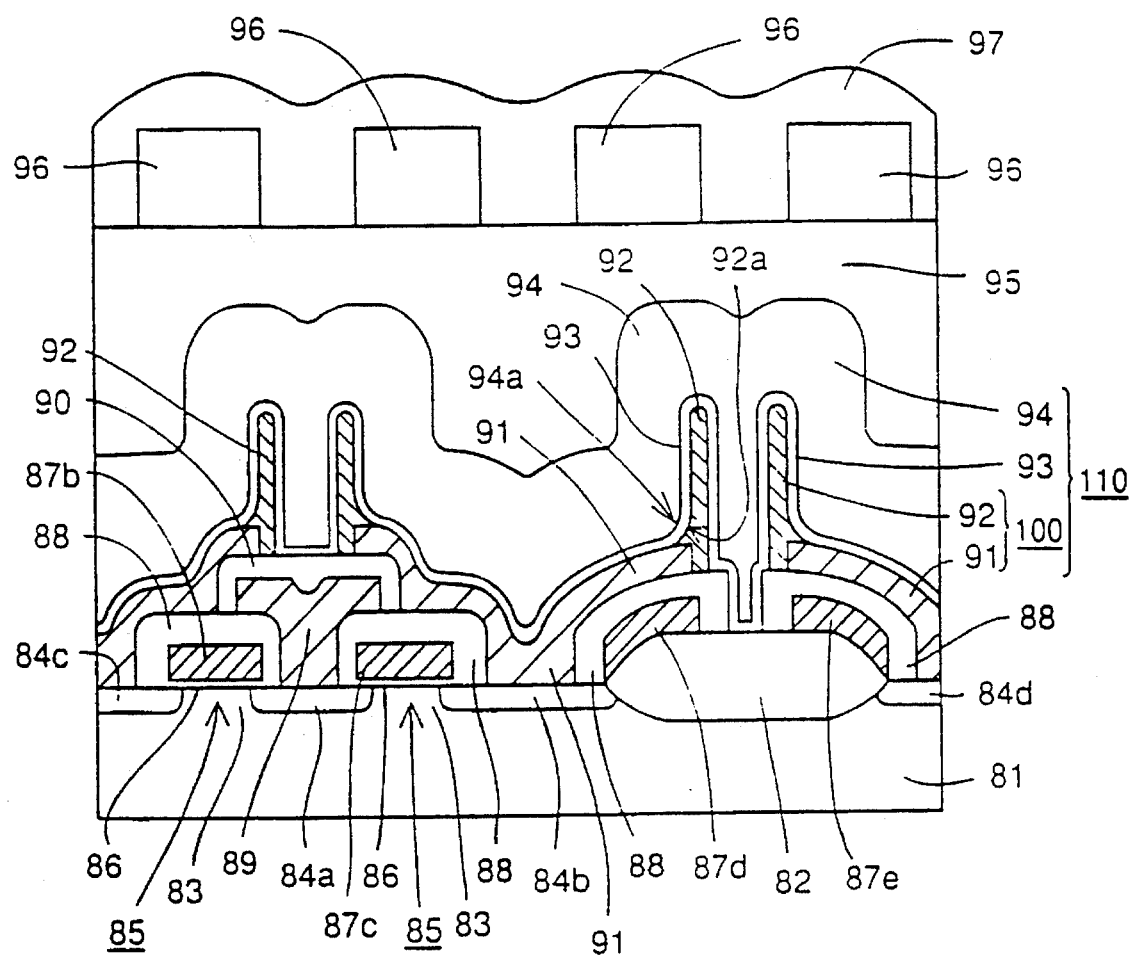
FIG. 31 is a cross section of a DRAM including a stacked type capacitor of a third embodiment of the invention.

Referring to FIG. 31, a DRAM of a third embodiment includes a silicon substrate 81, an element separating oxide film 82 formed on a predetermined region of a major surface of the silicon substrate 81 for separating elements, source/drain regions 84a, 84b, 84c and 84d which are formed in regions surrounded by the element isolating oxide film 82 and are located at opposite sides of a channel region 83 with predetermined spaces therebetween, gate electrodes (word lines) 87b and 87c formed on the channel region 83 with a gate oxide film 86 therebetween, word lines (gate electrodes) 87d and 87e formed on the element isolating oxide film 82 with a predetermined space therebetween, an insulating film 88 covering the gate electrodes 87b, 87c, 87d and 87e, a buried bit line 89 electrically connected to the source/drain region 84a, an insulating film 90 covering the buried bit line 89, a base portion 91 which is electrically connected to the source/drain region 84b and extends over and along the insulating films 88 and 90 to form a capacitor lower electrode 100, a standing wall portion 92 which extends along the outermost edge of the base portion 91 in a direction perpendicular to the silicon substrate 81 and forms a capacitor lower electrode 100, a capacitor insulating film 93 covering the standing wall portion 92, a cell plate 94 covering the capacitor insulating film 93, an interlayer insulating film 95 covering the cell plate 94 and having a flattened surface, interconnection layers 96 formed on the interlayer insulating film 95 to correspond to the gate electrodes 87b, 87c, 87d and 87e with predetermined spaces therebetween, and a protection film 97 covering the interconnection layer 96.

The source/drain regions 84a and 84b and the gate electrode 87c form the transfer gate transistor 85 of one of the memory cells. The source/drain regions 84a and 84c and the gate electrode 87b form the transfer gate transistor 85 of the other memory cell. The base portion 91 and the standing wall portion 92, which form the capacitor lower electrode, as well as the capacitor insulating film 93 and the cell plate 94 form a stacked type capacitor 110 for storing charges corresponding to a data signal. The separating oxide film 82 is formed of a silicon oxide film having a thickness of about 4000 Å. The gate electrodes 87b, 87c, 87d and 87e are formed of polysilicon layers containing a large amount of doped arsenic. The insulating films 88 and 90 are formed of silicon nitride films ($Si_3N_4$) or silicon oxide films each having a thickness of about 500 Å. The capacitor insulating film 93 is formed of a silicon nitride film, a silicon oxide film or a composite film thereof, or is formed of a tantalum pentoxide film ($Ta_2O_5$), a hafnium oxide film ($HaO_2$) or others. The base portion 91 forming the capacitor 110 is formed of a polysilicon layer containing a large amount of doped arsenic. The cell plate 94 is formed of a polysilicon layer containing a large amount of doped phosphorous and having a crystal grain diameter of about 200 Å–500 Å. The standing wall portion 92 forming the capacitor lower electrode 100 is formed of a polysilicon layer having a large crystal grain diameter (1000 Å–10000 Å).

In the third embodiment, the standing wall portion 92 forming the capacitor lower electrode 100 has a portion 92a, which is formed on the surface of the base portion 91. The thickness of the portion 92a gradually increases downward. Thereby, a bent shape of joined portions of the base portion 91 and the standing wall portion 92 is made moderate as compared with the prior art. Consequently, a macroscopically protruding shape of an end 94a of the cell plate 94, which is opposed to the moderately bent portion 92a, is also made moderate. This can reduce the concentration of field to the capacitor insulating film 93 at the end 94a of the cell plate 94. Thereby, the durability of the capacitor insulating film 93 is improved.

Referring no FIGS. 31–33, a manufacturing process of the standing wall portion 92 forming the capacitor lower electrode of the third embodiment will be described below.

Figure 32:
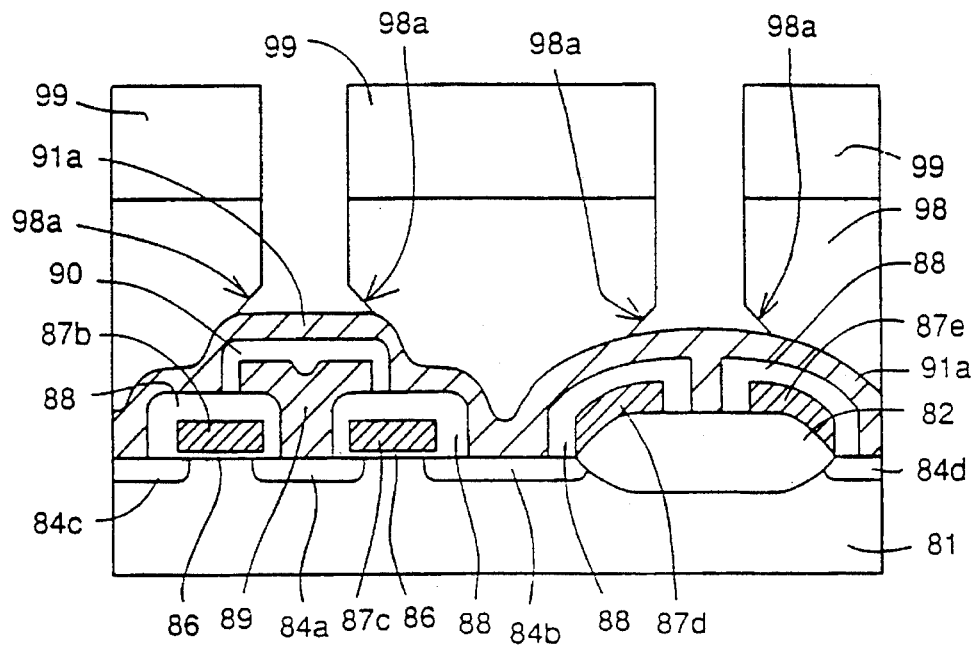
FIGS. 32 and 32 are cross sections showing 1st and 2nd steps in a manufacturing process of a DRAM of the third embodiment shown in FIG. 31, respectively.

FIG. 32 shows a manufacturing step corresponding to the manufacturing step of a DRAM of a second embodiment shown in FIG. 24. When an interlayer insulating film 98 is selectively etched, using resist 99 as a mask, a notch or recess 98a is formed at a joined region of the interlayer insulating film 98 and a polysilicon layer 91a located under the end of the resist 99. More specifically, at a final stage of the etching process of the interlayer insulating film ($SiO_2$) 98, a density of etching gas plasma (e.g., $CF_4$ or $CHF_3$) is increased. As a method for increasing the density of the etching plasma, a pressure in an etching chamber may be increased from 5mTorr to 20mTorr. By increasing the density of the etching gas plasma at the final stage of the etching process of the interlayer insulating film 98, the notch 98a can be easily formed. Thereafter, the resist 99 is removed.

Figure 33:
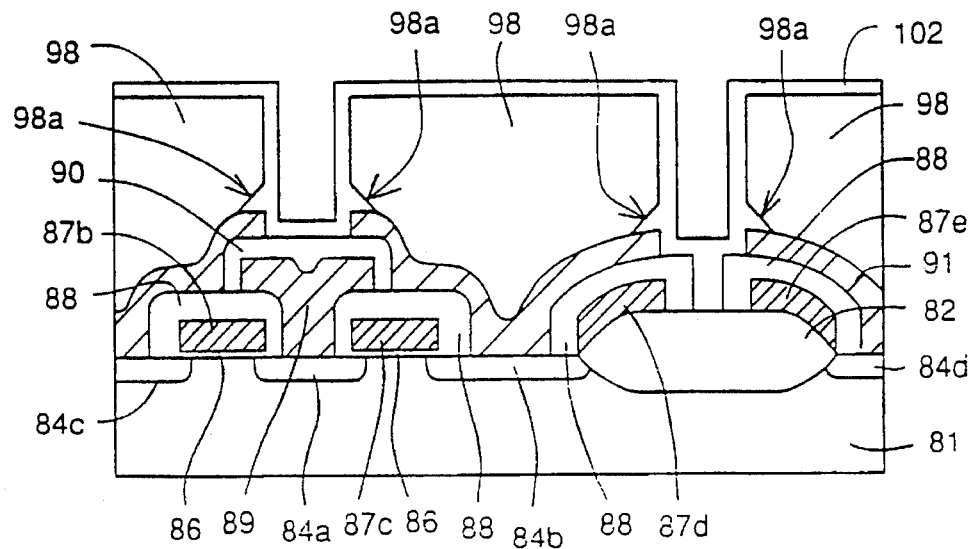
Figure 34:
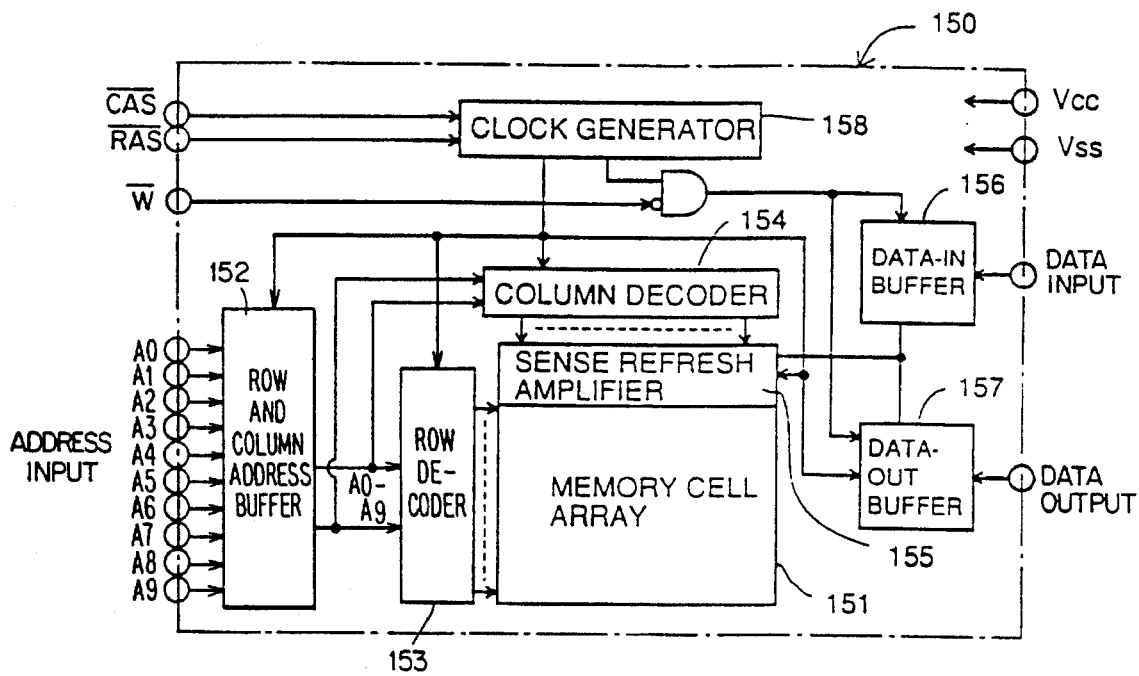
FIG. 34 is a block diagram of a conventional DRAM in the prior art
Figure 35:
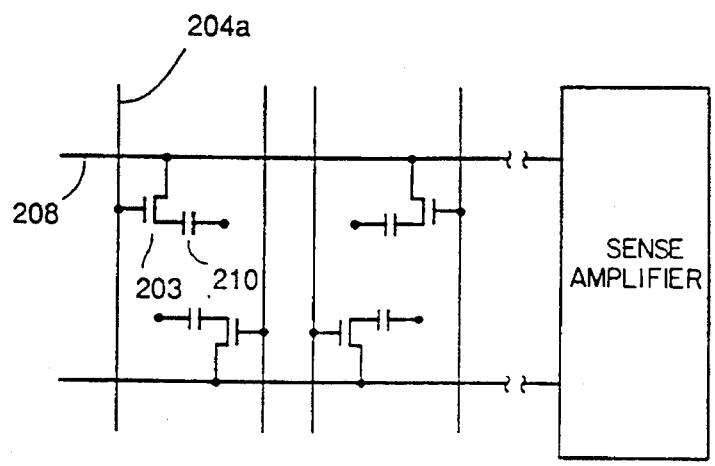
FIG. 35 is an equivalent circuit diagram of a memory cell of a DRAM n the prior art.
Figure 36:
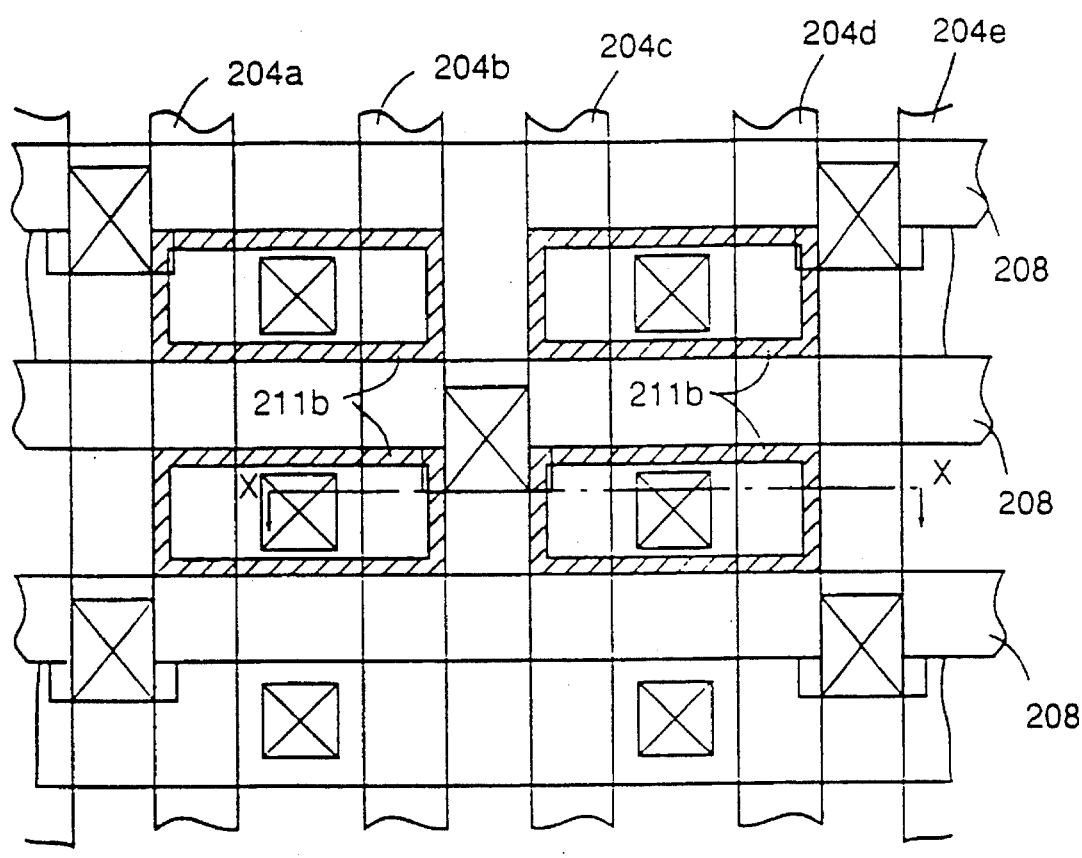
FIG. 36 is a plan of a DRAM having a stacked type capacitor proposed in the prior art.
Figure 37:
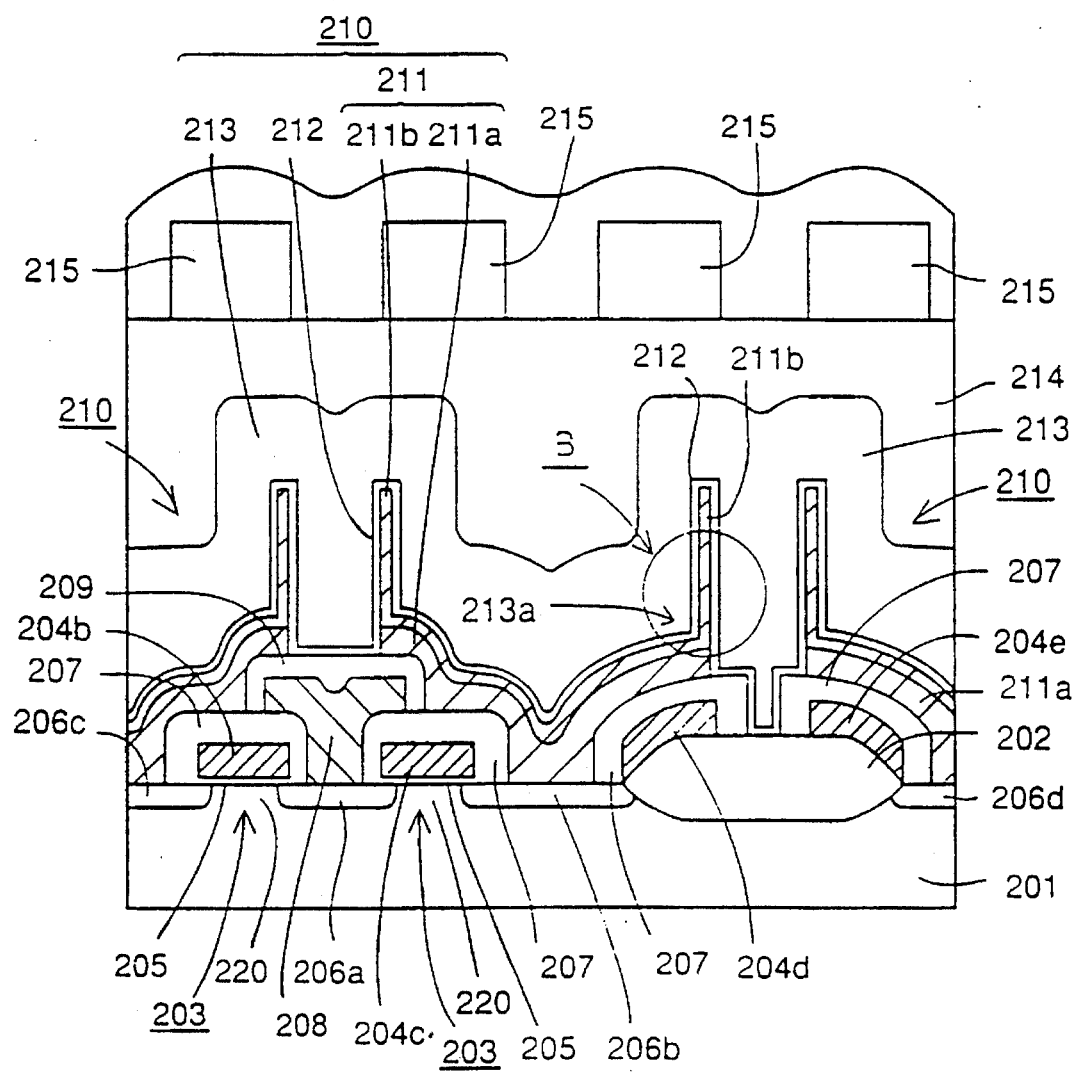
FIG. 37 is a cross section of a DRAM taken along line X—X in FIG.
Figure 41:
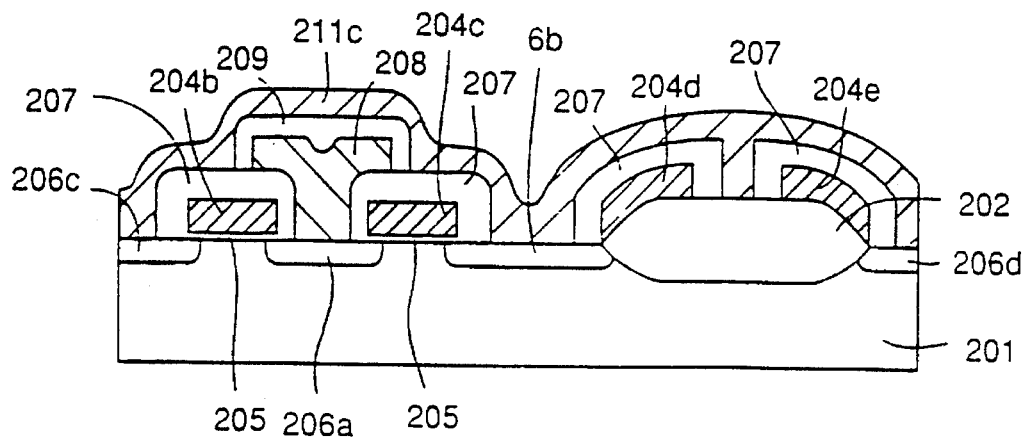
Figure 42:
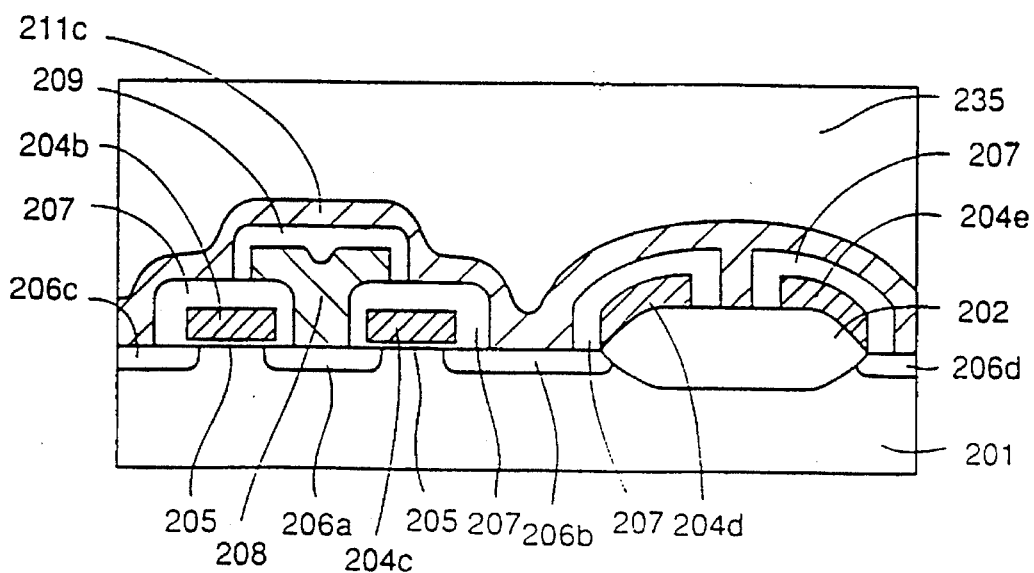
Figure 43:
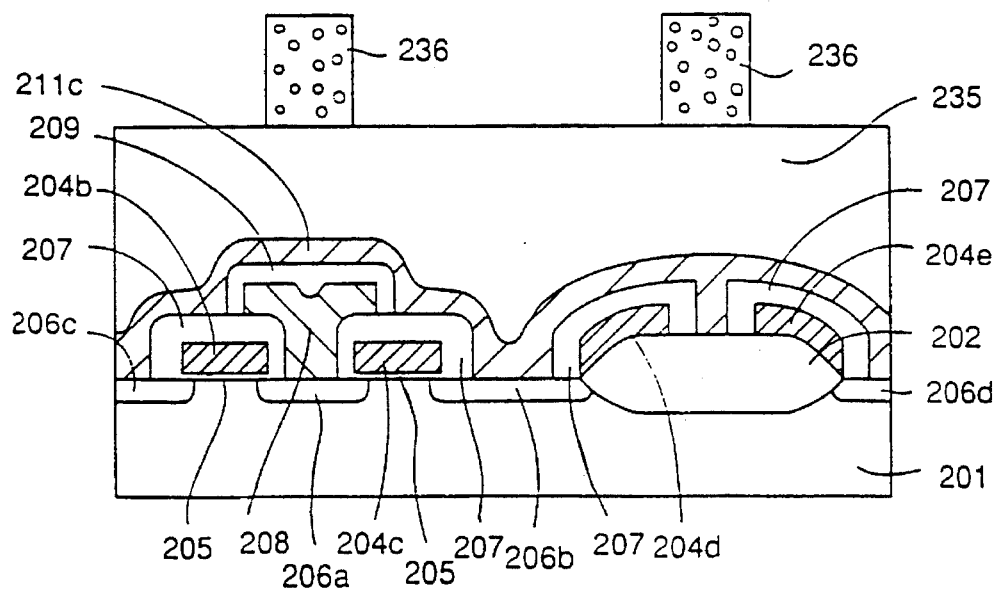
Figure 44:
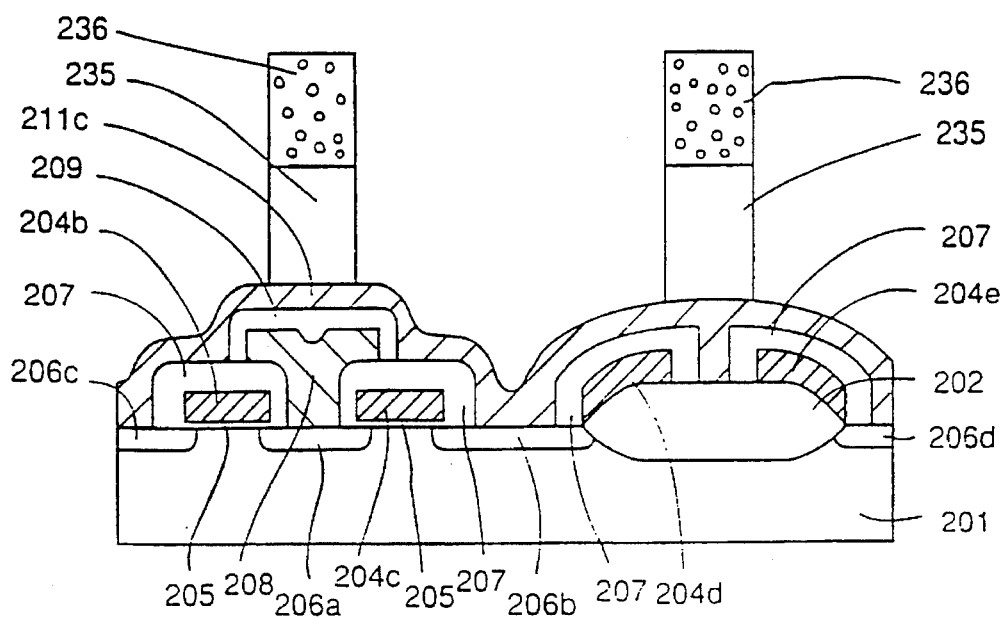
Figure 45:
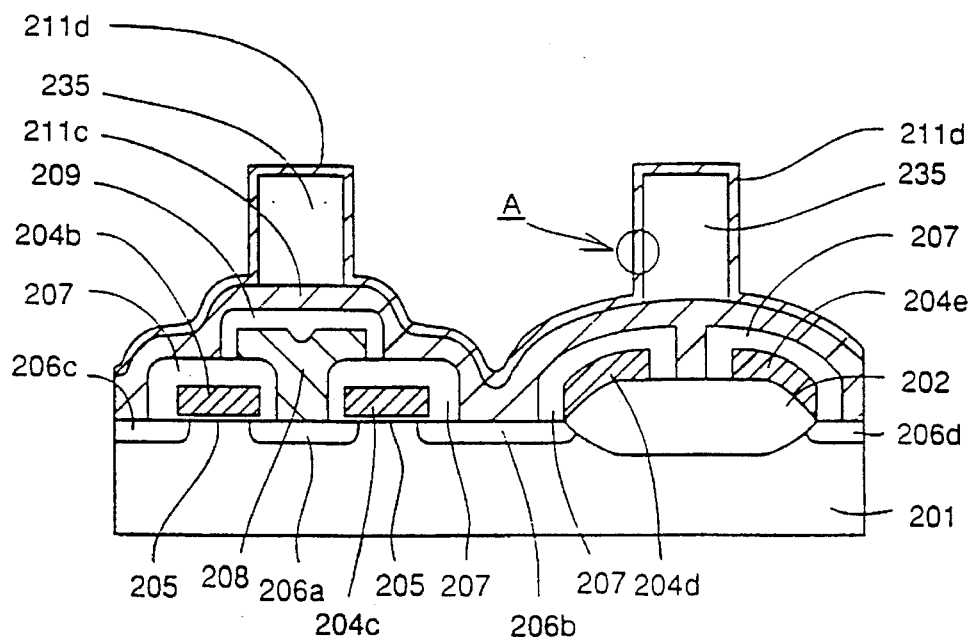
Figure 46:
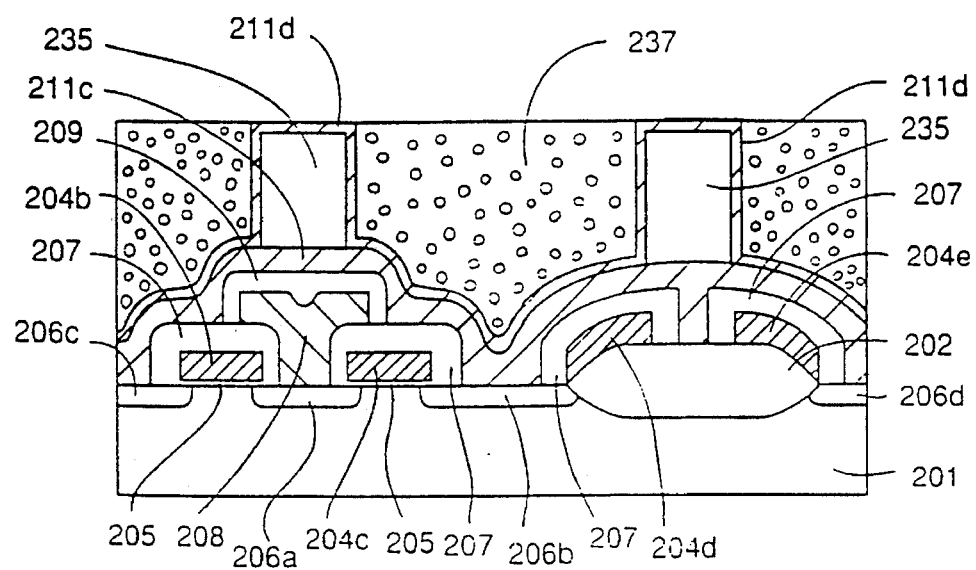
Figure 47:
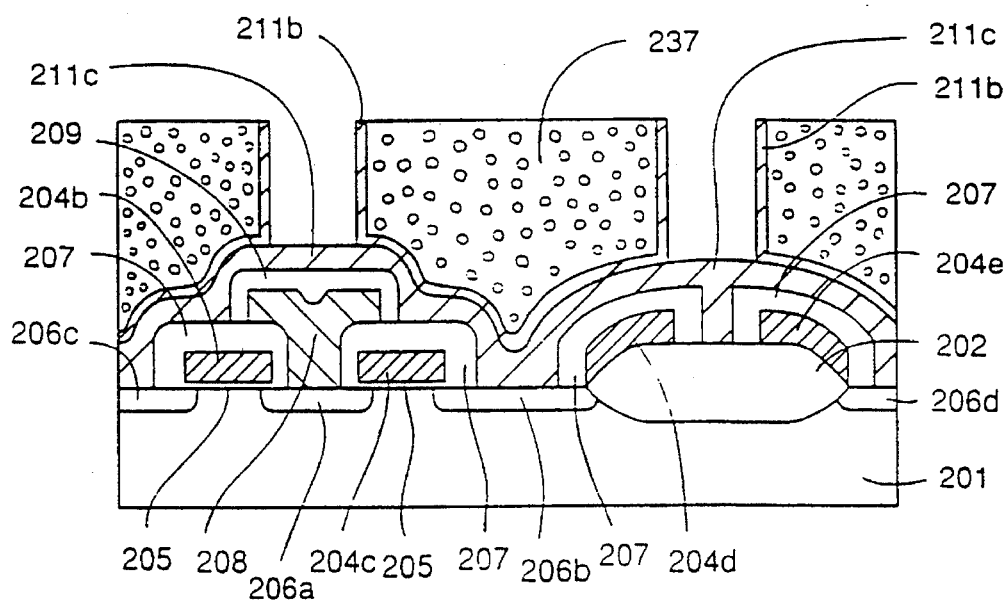
Figure 48:
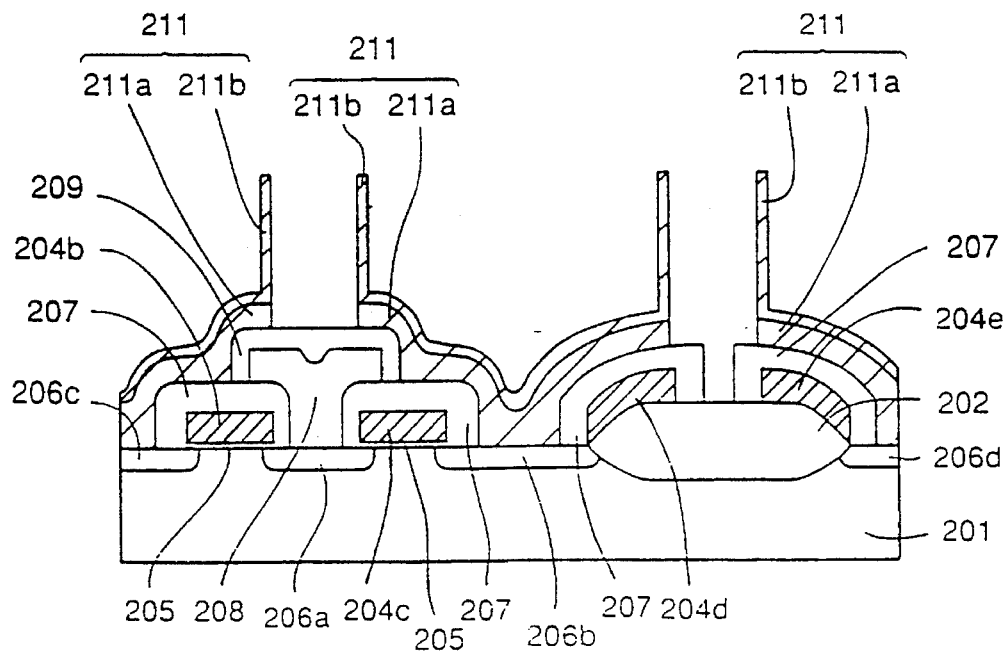
Figure 49:
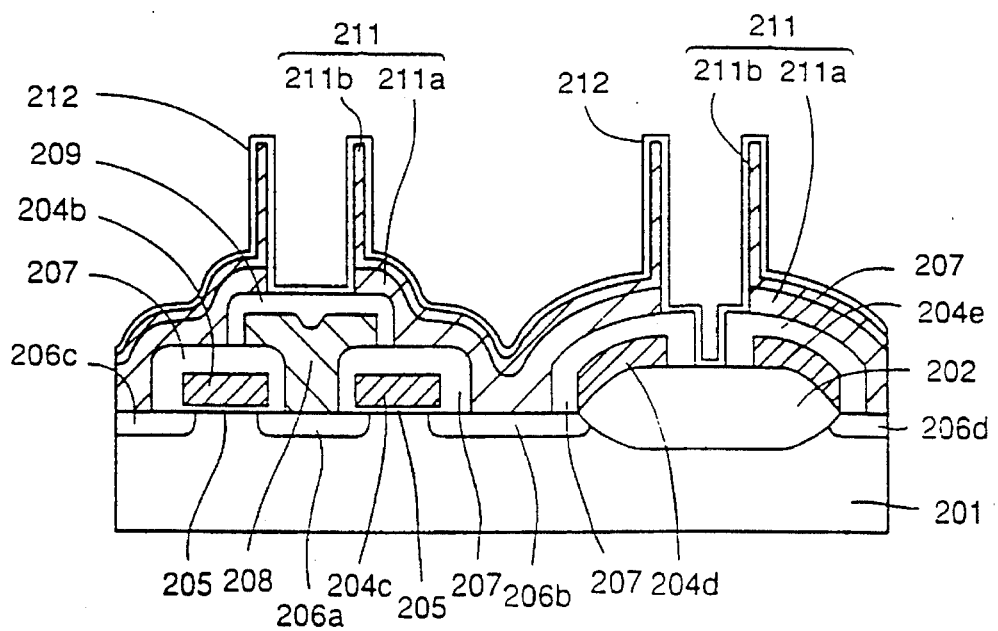
Figure 50:
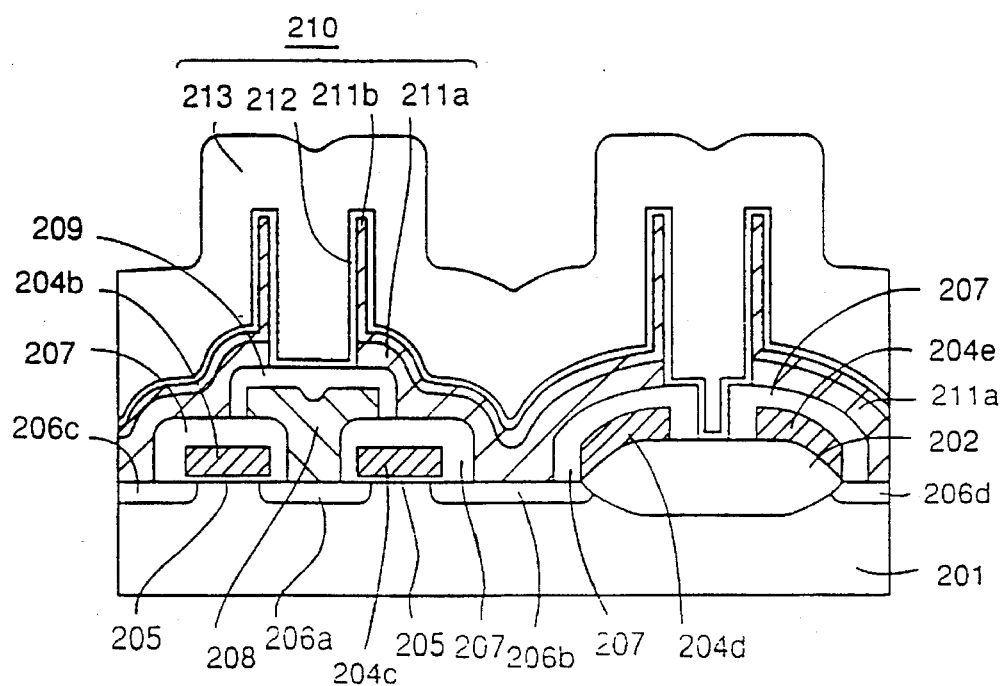
Figure 51:
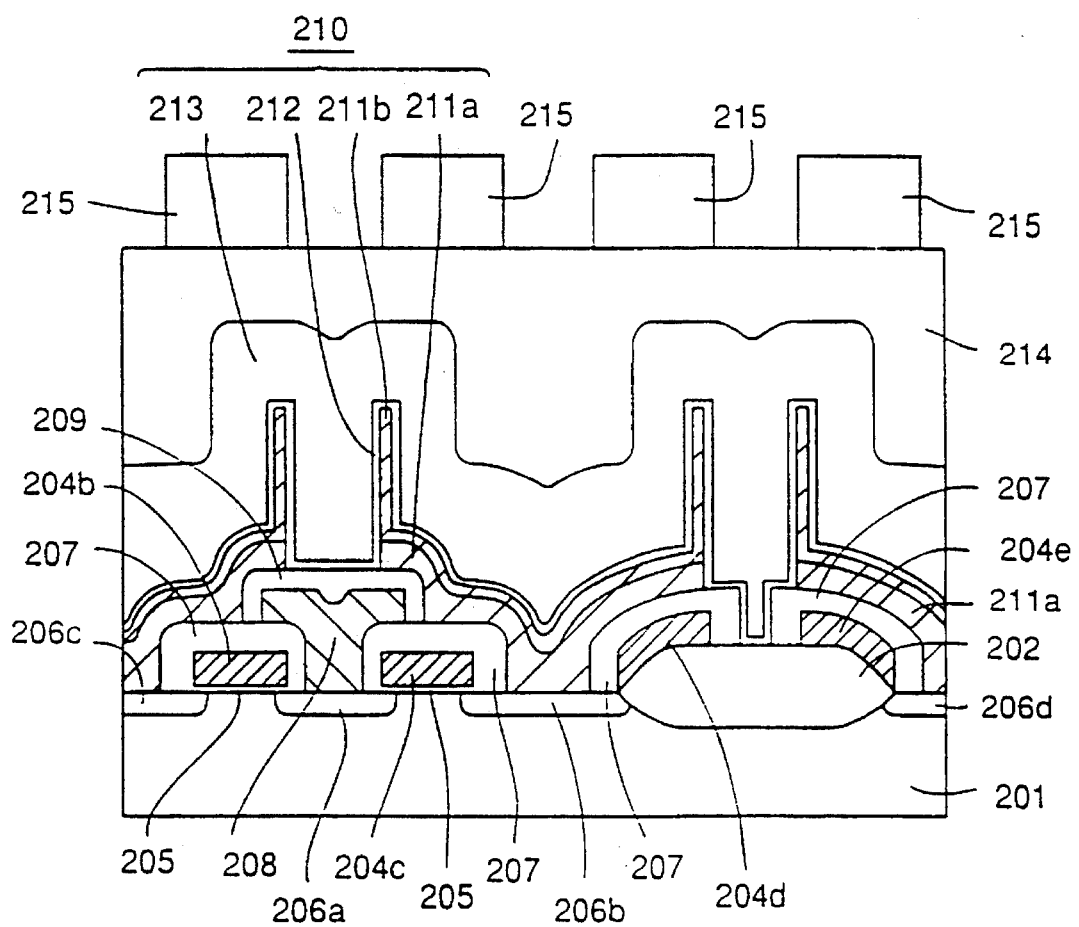

As shown in FIG. 33, the polysilicon layer 91a (see FIG. 32) is selectively removed, using the interlayer insulating film 98 as a mask. Thereby, the base portion 91 forming the capacitor lower electrode is formed. An amorphous silicon layer 102 is formed on the whole surface. More specifically, the amorphous silicon layer 102, which contains a large amount ($2\times10^{20}/cm^3$) of doped arsenic (As) or phosphorus (P), is formed by the CVD method under the temperature condition of 500° C. –550° C., using gas mixture of $SiH_4$ and $AsH_3$ or gas mixture of $SiH_4$ and $PH_3$ as material. The amorphous silicon layer 102 thus formed is has a portion located in the notch 98a of the interlayer insulating film 98. Thereafter, the manufacturing seeps similar to those shown in FIGS. 27–30 are executed, and the DRAM of the third embodiment shown in FIG. 31 is completed.

According to the semiconductor device of the first aspect of the invention, the capacitor lower electrode is formed of the first portion, which is in contact with the surfaces of the impurity region and the insulating layer and is formed or the silicon crystal having the first grain diameter, and of the second portion, which is in contact with at lease the outermost edge of the first portion, extends upward from the major surface of the semiconductor substrate and is formed of the silicon crystal having the second grain diameter larger than the first grain diameter. Thereby, the number of the microscopically concave and convex portions of the surface of the second portion is reduced, which prevents the irregularity of the field applied to the capacitor insulating film covering the second portion. As a result, the durability of the capacitor insulating film can be improved.

According of the semiconductor device of the second aspect of the invention, the capacitor lower electrode is formed of the first portion, which is in contact with the surfaces of the impurity region and the insulating layer, and of a second portion, which is in contact with at least the outermost edge of the first portion, and extends upward from the major surface of the semiconductor substrate. The portion of the second portion located on the upper surface of the outermost edge of the first portion has the thickness, in the direction along the major surface of the semiconductor substrate, which gradually increases toward the lower side. Therefore, the bent shape of the region at which the first and second portions are joined is made moderate. Thereby, the protruding shape of the end of the capacitor upper electrode, which is formed on the bent region with the capacitor insulating film therebetween, can be made moderate. This effectively prevents the concentration of the field to he capacitor insulating film at the macroscopical protrusion of the capacitor upper electrode. Thereby, the durability of the capacitor insulating film can be improved.

According to the manufacturing method of the semiconductor device of an aspect of the invention, the first insulating layer located on the major surface of the semiconductor substrate and having the opening, which is located at the predetermined position and reaches the major surface of the semiconductor substrate, is formed. The first conductive layer located in the opening and being in contact with the surface of the first insulating layer is formed. The second insulating layer is formed on the predetermined region of the first conductive layer. The amorphous silicon layer is formed to cover at least the second insulating layer. The amorphous silicon layer is removed by the etching at least from an upper surface of the second insulating layer, and thereby the upper surface of the second insulating layer is exposed. The exposed second insulating layer is removed by etching. The capacitor insulating layer covering the amorphous silicon layer is formed. The amorphous silicon layer is polycrystallized to form the polysilicon layer. The second conductive layer covering the capacitor insulating layer is formed. Therefore, the surface roughness of the amorphous silicon layer is not increased by the etching, and thus the surface roughness of the polycrystal silicon layer, which is formed by the crystallization of the amorphous silicon layer after the etching, can be reduced. Owing to this, the irregularity of the field applied to the capacitor insulating layer, which finally covers the polysilicon layer, is prevented. As a result, the durability of the capacitor insulating layer can be improved.

According to the manufacturing method of the semiconductor device of another aspect of the invention, the first insulating layer is formed on the major surface of the semiconductor substrate. The first insulating layer has the opening, which is located at the predetermined position and reaches the major surface of the semiconductors substrate. the first conductive layer, which is located in the opening and is in contact with the surface of the firs insulating layer, is formed. The second insulating layer is formed on the predetermined region of the first conductive layer. The etching mask is formed on the determined region of the second insulating layer. The etching is applied to the second insulating layer, using the etching mask as a mask, to remove the second insulating layer located at the region on which the etching mask is not formed and to excessively remove the second insulating layer at that region, which is located under the side end of the etching mask and is in contact with the first insulating layer, to the predetermined extent. The second conductive layer covering the second insulating layer is formed after the removal of the etching mask. The residual second insulating layer is removed after patterning the second conductive layer. The capacitor insulating layer covering the first and second conductive layers is formed. The third conductive layer covering the capacitor insulating layer is formed. Therefore, the second conductive layer enters a portion from which the second insulating layer is excessively removes, so that a bent portion at a joined region of the first and second conductive layers has a dull shape. Thereby, a protruding shape of the third conductive layer, which is formed on the bent portion with the capacitor insulating layer therebetween, is made moderate. Consequently, the concentration of the field to the capacitor insulating layer located at the protruded portion of the third conductive layer can be prevented. Thereby, the durability of the capacitor insulating layer can be improved.

Although the present invention has been described and illustrated in detail, it is clearly understood that the same is by way off illustration and example only and is not to be taken by way of limitation, the spirit and scope of the present invention being limited only by the terms of the appended claims.

What is claimed is:

1. A method of manufacturing a semiconductor device, comprising the steps of:

forming a first insulating layer located on a major surface of a semiconductor substrate and having an opening which reaches said major surface of said semiconductor substrate;

forming a first conductive layer located in said opening and being in contact with a surface of said first insulating layer;

forming a second insulating layer above said first conductive layer;

forming an amorphous silicon layer having a thickness of not more than 0.1 µm and covering at least said second insulating layer to form a lower electrode of a cylindrical capacitor;

removing said amorphous silicon layer at least from an upper surface of said second insulating layer and thereby exposing said upper surface of said second insulating layer;

removing said exposed second insulating layer by etching;

forming a capacitor insulating layer covering said amorphous silicon layer;

polycrystallizing said amorphous silicon layer to form a polysilicon layer; and forming a second conductive layer covering said capacitor insulating layer.

2. A manufacturing method of a semiconductor device according to claim 1, wherein said step of forming said amorphous silicon layer includes the step of forming an amorphous silicon layer having a surface roughness of about 10 Å or less, using a CVD method.

3. A manufacturing method of a semiconductor device according to claim 1, wherein said step of forming said polysilicon layer includes the step of forming a polysilicon layer having a crystal grain diameter in a range from about 1000 Å to about 10000 Å and a surface roughness of about 10 Å or less.

4. A method of manufacturing a semiconductor device, comprising the steps of:

forming a first insulating layer located on a major surface of a semiconductor substrate and having an opening which reaches said major surface of said semiconductor substrate;

forming a first conductive layer located in said opening and being in contact with a surface of said first insulating layer;

forming a second insulating layer above said first conductive layer;

forming an etching mark on said second insulating layer;

applying etching to said second insulating layer, using said etching mask as a mask, to remove said second insulating layer at a region, on which said etching mask is not formed, and to further remove said second insulating layer to form an undercut at a region, which is located under a side end of said second insulating layer and is adjacent said first insulating layer;

forming a second conductive layer covering said second insulating layer after removal of said etching mask;

removing said residual second insulating layer after patterning said second conductive layer;

forming a capacitor insulating layer covering said first and second conductive layers; and forming a third conductive layer covering said capacitor insulating layer.

5. A method of manufacturing a semiconductor device according to claim 4, wherein said step of further removing said second insulating layer to a predetermined extent includes the step of etching said second insulating layer under a condition, in which a density of etching gas plasma is increased, for further removing said second insulating layer.

6. A method of manufacturing a semiconductor device according to claim 4, wherein said steps of forming said second conductive layer includes the steps of forming an amorphous silicon layer having a surface roughness of about 10 Å or less, using a CVD method; and polycrystallizing said amorphous silicon layer for ultimately forming said second conductive layer formed of a polysilicon layer having a crystal grain diameter of about 1000 Å–10000 Å and a surface roughness of about 10 Å or less.

\* \* \* \* \*